(12) United States Patent
Tachibana et al.

(10) Patent No.: US 7,199,745 B2
(45) Date of Patent: Apr. 3, 2007

(54) SUCCESSIVE APPROXIMATION A/D CONVERTER PROVIDED WITH A SAMPLE-HOLD AMPLIFIER

(75) Inventors: Suguru Tachibana, Kawasaki (JP); Kazuhiro Mitsuda, Kawasaki (JP); Tatsuo Kato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/273,025

(22) Filed: Nov. 15, 2005

(65) Prior Publication Data

US 2007/0035434 A1 Feb. 15, 2007

(30) Foreign Application Priority Data

Aug. 12, 2005 (JP) .............................. 2005-234724

(51) Int. Cl.
*H03M 1/34* (2006.01)
(52) U.S. Cl. ...................................... 341/163; 341/155
(58) Field of Classification Search ................ 341/172, 341/161, 155, 144
See application file for complete search history.

(56) References Cited

U.S. PATENT DOCUMENTS

| 4,803,462 | A | | 2/1989 | Hester et al. ................ 341/172 |
| 5,684,487 | A | * | 11/1997 | Timko .......................... 341/172 |
| 6,400,302 | B1 | * | 6/2002 | Amazeen et al. ............ 341/172 |
| 6,897,801 | B2 | * | 5/2005 | Confalonieri et al. ....... 341/172 |
| 7,026,975 | B1 | * | 4/2006 | Steward et al. ............. 341/161 |

FOREIGN PATENT DOCUMENTS

JP 10-336033 A 12/1998

OTHER PUBLICATIONS

Richard K. Hester et al., "Fully Differential ADC with Rail-to-Rail Common-Mode Range and Nonlinear Capacitor Compensation", IEEE Journal of Solid-State Circuits, vol. 25, No. 1, Feb. 1990, pp. 173-183.

Larry A. Singer et al., "A 14-Bit 10-MHz Calibration-Free CMOS Pipelined A/D Converter", Symposium on VLSI Circuits, 1996, pp. 94-95.

Gilbert Promitzer, 12-Bit Low-Power Fully Differential Switched Capacitor Noncalibrating Successive Approximation ADC with 1 MS/s, IEEE Journal of Solid-State Circuits, vol. 36, No. 7, Jul. 2001, pp. 1138-1143.

* cited by examiner

*Primary Examiner*—Peguy JeanPierre
(74) *Attorney, Agent, or Firm*—Arent Fox LLP

(57) ABSTRACT

A successive approximation A/D converter includes a sample-hold amplifier circuit configured to sample and hold an input analog voltage to produce an internal analog voltage proportional to the input analog voltage with a voltage gain being smaller than 1, a switched capacitor D/A converter coupled to the sample-hold amplifier circuit and including a plurality of capacitors for storing electric charge responsive to the internal analog voltage, the switched capacitor D/A converter configured to switch couplings of the capacitors in response to a control signal to produce a comparison analog voltage responsive to the internal analog voltage and the control signal, a comparator coupled to the switched capacitor D/A converter to produce a comparison result signal responsive to the comparison analog voltage, and a control circuit coupled to the comparator to supply the control signal responsive to the comparison result signal to the switched capacitor D/A converter.

7 Claims, 29 Drawing Sheets

AT END OF COMPARISON

FIG.20 { early, late, conv
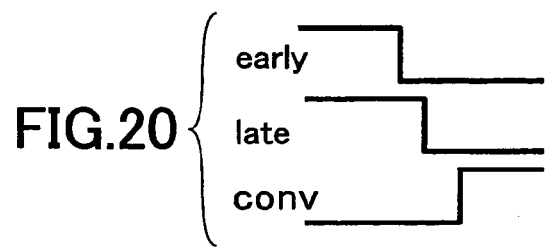
FIG.21
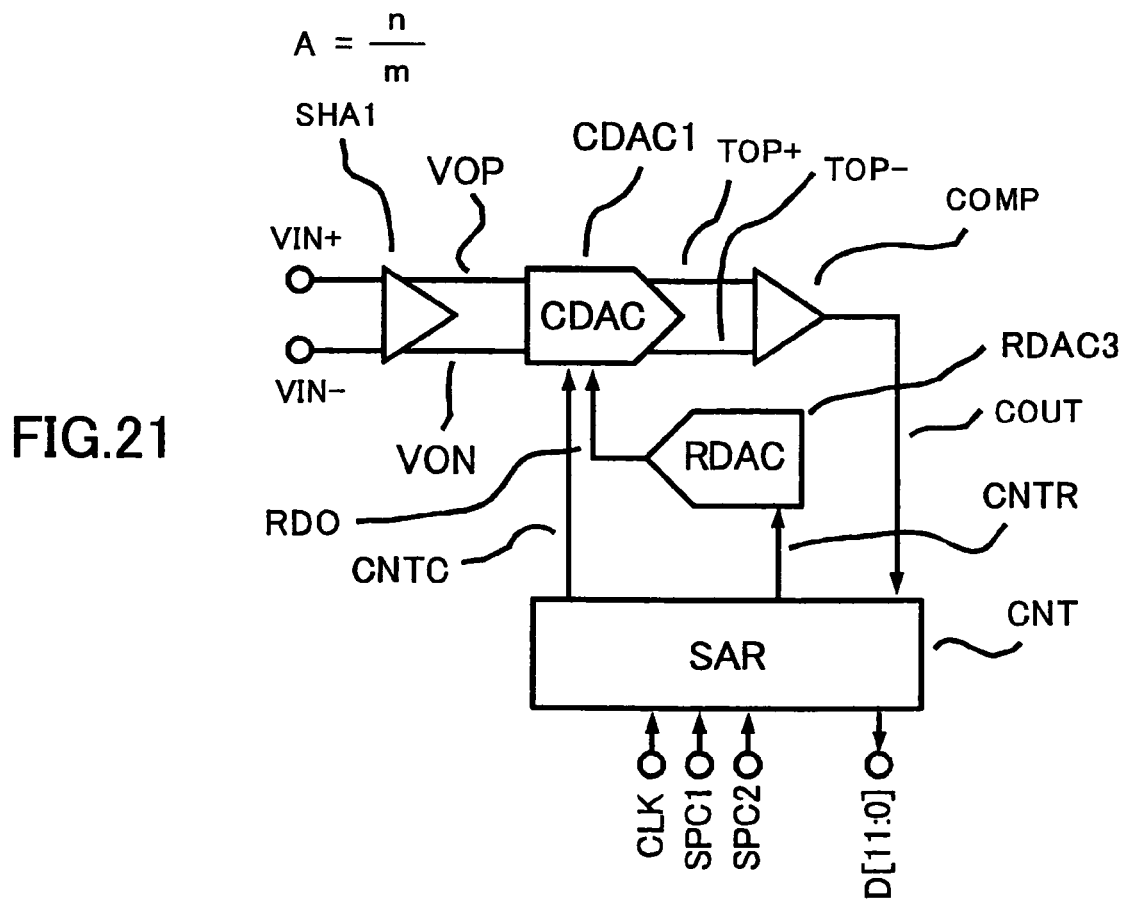

SUCCESSIVE APPROXIMATION A/D CONVERTER PROVIDED WITH A SAMPLE-HOLD AMPLIFIER

CROSS-REFERENCE TO RELATED APPLICATIONS

The present application is based upon and claims the benefit of priority from the prior Japanese Patent Application No. 2005-234724 filed on Aug. 12, 2005, with the Japanese Patent Office, the entire contents of which are incorporated herein by reference.

BACKGROUND OF THE INVENTION

1. Field of the Invention

The present invention generally relates to successive approximation A/D converters, and particularly relates to a successive approximation A/D converter utilizing a switched capacitor D/A converter.

2. Description of the Related Art

Successive approximation A/D converters can be implemented by use of relatively simple circuit configurations, and can be manufactured at relatively low cost due to their suitability for CMOS process while providing moderate conversion time and moderate conversion accuracy. This is why successive approximation A/D converters are used in a variety of fields. FIG. 1 is a drawing showing a differential switched capacitor DAC used in a related-art charge redistribution A/D converter, which is a representative configuration of the successive approximation A/D converter. Patent Document 1 discloses a similar circuit.

In the following, the configuration and operation of the circuit shown in FIG. 1 will be described briefly. The circuit of FIG. 1 includes switches SW1 through SW14, capacitors C1 through C12, and a comparator COMP1. VIN+ indicates a plus-side analog input (+) and VIN− indicates a minus-side analog input (−), together forming differential inputs. Furthermore, TOP+ designates a plus-side top plate of a capacitor array, and TOP− designates a minus-side top plate of the capacitor array. Vref+ is a plus-side reference potential (5V), and Vref− is a minus-side reference potential (0V). GND is the potential (2.5V) of the signal ground of this circuit. Furthermore, VCM2 is a bias potential applied to the top plate at the time of sampling, and COUT1 is the output of the comparator.

Capacitors C1 through C6 have relative capacitances 1C, 1C, 2C, 4C, 8C, and 16C, respectively. By the same token, capacitors C7 through C12 have relative capacitances 1C, 1C, 2C, 4C, 8C, and 16C, respectively.

The positions of the switches illustrated in FIG. 1 show their positions at the time of sampling. At the time of sampling, the potential VIN+ is charged in capacitors C1 through C6, and the potential VIN− is charged in capacitors C7 through C12. After the end of the sampling, switches SW13 and SW14 are opened, and the switches SW1 through SW12 are manipulated. Through the manipulation of the switches SW1 through SW12, the potential at the bottom plates of the capacitors C1 through C12 (i.e., these ends of the capacitors connected to the switches SW1 through SW12) are selectively set to either one of Vref+, Vref−, and GND.

In the following, a description will be given of the plus-side as a concrete example. At the time of sampling, all of the capacitors C1 through C6 are charged to the analog input potential VIN+. After the sampling, the switch SW13 is opened to place TOP+ in a floating state. Then, the capacitors C1 through C5 are coupled to GND through the switches SW1 through SW5, respectively, and the capacitor C6 is coupled to the reference potential Vref+ through the switch SW6, for example. Through these couplings, charge accumulated by the input potential VIN+ at the time of sampling is redistributed between the sampling capacitors C1 through C6, resulting in the potential of TOP+ being ((Vref+)−GND)/2−VIN+. Namely, in this case, the voltage between Vref+ and GND is divided by half by a capacitance of 16C of the capacitor C6 and a capacitance of 16C that is the total capacitance of the capacitors C1 through C5. The input potential VIN+ is then subtracted from the divided potential to generate the potential of TOP+.

Manipulating the couplings of the switches SW1 through SW6 makes it possible to change a ratio by which the voltage between Vref+ and GND is divided by capacitors, thereby adjusting the potential of TOP+. The same applies in the case of the minus-side. Manipulating the couplings of the switches SW7 through SW12 makes it possible to change a ratio by which the voltage between Vref− and GND is divided by capacitors, thereby adjusting the potential of TOP−. The comparator COMP1 receives the potential of TOP+ and the potential of TOP− as inputs thereof, and generates the output COUT1 responsive to a difference between the two potentials. Couplings of the switches SW1 through SW12 are successively changed according to the output COUT1, thereby controlling the couplings of the switches until a desired output is obtained. With this provision, a digital code (the state of the switches) corresponding to the difference between the analog input potentials VIN+ and VIN− is searched for through the control that is based on the output COUT1.

FIG. 2 is a drawing showing another circuit example of a successive approximation A/D converter. In FIG. 2, the same elements as those of FIG. 1 are referred to by the same numerals, and a description thereof will be omitted.

In the circuit configuration shown in FIG. 2, an amplifier AMP1 is provided on the input side. The amplifier AMP1 amplifies the analog input potentials VIN+ and VIN− to produce amplified potentials IVINP and IVINN. The amplified potentials IVINP and IVINN are then sampled by the capacitor array, thereby performing an A/D conversion operation the same as previously described. The use of the circuit configuration shown in FIG. 2 makes it possible to achieve a faster sampling speed by charging the capacitors C1 through C12 through the amplifier AMP1 at the time of sampling.

Successive approximation A/D converters can achieve moderate conversion time and moderate conversion accuracy, and are applicable to a wide variety of fields. In the application fields where higher speed (higher sampling rate) and lower power consumption are required, pipeline A/D converters are employed. The pipeline A/D converters use a sample-hold amplifier circuit for sampling an analog signal for the purpose of achieving a higher sampling rate.

FIG. 3 is a drawing showing an example of the configuration of a related-art sample-hold amplifier circuit. Non-Patent Document 3 discloses a similar circuit.

The circuit shown in FIG. 3 includes switches SW15 through SW23, capacitors C13 through C16, and an amplifier AMP2. VIN+ indicates a plus-side analog input and VIN− indicates a minus-side analog input. VOP is a plus-side output, and VON is a minus-side output. Moreover, NODE1 through NODE4 indicate internal nodes. Furthermore, BIAS1 is the bias potential of the bottom plate of the capacitors C15 and C16 at the time of sampling.

The positions of the switches illustrated in FIG. 3 show their positions at the time of sampling. At the time of sampling, the potential VIN+ is charged in the capacitor C13, and the potential VIN− is charged in the capacitor C14. In the hold state, the switches SW18, SW19, SW20, and SW21 are opened, and the switches SW17, SW22, and SW23 are closed. With this provision, the part of the charge stored in the capacitors C13 and C14 that corresponds to the potential difference between VIN+ and VIN− is transferred to the capacitors C15 and C16, so that the potential difference between VIN+ and VIN− is output as a plus-side output VOP and a minus-side output VON.

By use of a sample-hold amplifier circuit as shown in FIG. 3, pipeline A/D converters achieve high-speed sampling operations.

There has been an attempt to make a circuit configuration that incorporates the function of a sample-hold amplifier into a successive approximation A/D converter. FIG. 4 is a drawing showing an example of a successive approximation A/D converter in which the function of a sample-hold amplifier is incorporated (see Patent Document 2).

The circuit shown in FIG. 4 includes switches SW24 through SW26, capacitors C17 through C24, and amplifiers AMP3 and AMP4. VIN is an analog input, and COUT2 is the output of the comparator. NODE5 through NODE7 indicate internal nodes. BOT1 through BOT5 are the bottom plates of capacitors. Moreover, Vdd/2 corresponds to half the potential of the power supply voltage. In the same manner as in FIG. 1 and FIG. 2, the value of nC (n is an integer) provided in the drawing beside the capacitors C17 through C24 indicates the relative size of each capacitor.

In the circuit of FIG. 4, the inverting amplification circuit comprised of the capacitors C17 and C18 and the amplifier AMP3 functions as a sample-hold amplifier circuit. The provision of this circuit portion eliminates the need to charge the capacitors of the switched capacitor DAC comprised of the capacitors C19 through C24 directly by the analog input signal. Through reduction in the capacitance of the capacitor C17, it is possible to make such a design that the input capacitance as viewed from VIN is small. This brings about an advantage of high-speed sampling.

As the miniaturization of circuits is further advanced, there is an increasing demand to implement CMOS digital circuits and CMOS analog circuits on the same chip. It is required to integrate, at as low cost as possible, the CMOS analog circuits achieving high performance that matches the high-speed performance of the fine CMOS digital circuits.

In this context, there is also an increasing demand to make faster the successive approximation A/D converters that achieve moderate conversion time and moderate conversion accuracy with small circuit size at low cost. In order to make successive approximation A/D converters faster, it is vital to increase the speed of a check performed at the comparator and to shorten the sampling time.

In the related-art configuration as shown in FIG. 1, however, the sampling capacitors are charged by use of the external analog input signals, so that the sampling time is limited by the capacitance of the sampling capacitors. It is thus difficult to shorten the sampling time sufficiently. In the related-art configuration as shown in FIG. 2, it is possible to increase the speed of sampling by charging the capacitors through a buffer amplifier at the time of sampling. It is not possible, however, to sample an input signal that falls outside the range of the output signal of the buffer amplifier. In the most typical circuit configuration, the voltage gain of the buffer amplifier would be 1. In this case, the application of an input signal having a voltage equal to the power supply voltage does not produce the output signal of the buffer amplifier that has amplitude equal to the power supply voltage. The output signal will become slightly smaller than the power supply voltage. Because of this, it is not possible to perform a proper A/D conversion when an input signal has an amplitude equal to the power supply voltage.

Like the related-art circuit shown in FIG. 2, the related-art sample-hold amplifier circuit shown in FIG. 3 functions as a buffer amplifier for analog input signals, thereby achieving higher sampling speed. Non-Patent Document 3 discloses an example of application to the pipeline A/D converter, but stops short of describing configuration, problems, solution that become issues when application to the successive approximation A/D converter is considered.

Patent Document 2 that discloses the related-art circuit shown in FIG. 4 only shows an amplifier whose voltage gain is equal to 1. As in the case of the related-art circuit shown in FIG. 2, Patent Document 2 stops short of describing the problems and solutions associated with the A/D conversion of signal inputs having an amplitude equal to the power supply voltage. Further, only the circuit configuration of a single-ended switched-capacitor buffer amplifier is disclosed. No example is given of application to a differential circuit that is advantageous against the noise generated by digital circuits in the system LSI.

[Patent Document 1] U.S. Pat. No. 4,803,462

[Patent Document 2] Japanese Patent Application Publication No. 10-336033

[Non-Patent Document 1] R. K. Hester et al., "Fully Differential ADC with Rail-to-Rail Common-Mode Range and Nonlinear Capacitor Compensation," IEEE Journal of Solid-State Circuits, Vol. 25, No.1, pp. 173–183, February 1990.

[Non-Patent Document 2] G. Promitzer, "12-bit Low-Power Fully Differential Switched Capacitor Noncalibrating Successive Approximation ADC with 1 MS/s," IEEE Journal of Solid-StateCircuits, Vol. 36, No.7, pp. 1138–1143, July 2001.

[Non-Patent Document 3] L. A. Singer et al. and "A14-Bit10-MHz Calibration-Free CMOS Pipelined A/D Converter" Symposium on VLSI Circuits, pp. 94–95, 1996.

Accordingly, there is a need for a successive approximation A/D converter that can perform A/D conversion on input signals having an amplitude equal to the power supply voltage, and that is provided with a sample-hold amplifier circuit for shortening the sampling time.

Further, there is a need for a specific circuit configuration of the above-noted sample-hold amplifier circuit.

Moreover, there is a need for a double-stage D/A converter that is suitable for the above-noted successive approximation A/D converter.

SUMMARY OF THE INVENTION

It is a general object of the present invention to provide a successive approximation A/D converter that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a successive approximation A/D converter particularly pointed out in the specification in such full, clear, concise, and exact terms as to enable a person having ordinary skill in the art to practice the invention.

To achieve these and other advantages in accordance with the purpose of the invention, the invention provides a successive approximation A/D converter, which includes a sample-hold amplifier circuit configured to sample and hold an input analog voltage to produce at an output node an internal analog voltage proportional to the input analog voltage with a voltage gain being smaller than 1, a switched capacitor D/A converter coupled to the output node of the sample-hold amplifier circuit and including a plurality of capacitors for storing electric charge responsive to the internal analog voltage, the switched capacitor D/A converter configured to switch couplings of the capacitors in response to a control signal to produce at an output node a comparison analog voltage responsive to the internal analog voltage and the control signal, a comparator coupled to the output node of the switched capacitor D/A converter to produce at an output node a comparison result signal responsive to the comparison analog voltage, and a control circuit coupled to the output node of the comparator to supply the control signal responsive to the comparison result signal to the switched capacitor D/A converter.

According to at least one embodiment of the present invention, a capacitor coupled to an output node of a switched capacitor sample-hold amplifier circuit is provided with a larger capacitance than a capacitor coupled to an input node. This provides a sample-hold amplifier circuit having the voltage gain thereof being smaller than 1.

According to at least one embodiment of the present invention, an output of a resistor D/A converter is coupled to one of the capacitors of the switched capacitor D/A converter that has the smallest capacitance. This provides a double-stage-type D/A converter.

According to at least one embodiment of the present invention, a sample-hold amplifier circuit having the voltage gain smaller than 1 and a switched capacitor D/A converter that samples the outputs of the sample-hold amplifier circuit are provided. With this provision, a potential difference proportional to the analog input potential difference can be supplied from the amplifier circuit to the switched capacitor D/A converter even when analog input potential difference is equal to the power supply voltage. Moreover, with the configuration in which the sample-hold amplifier circuit samples the analog signals, the input capacitance of the sample-hold amplifier circuit can be designed independently of the switched capacitor D/A converter. Reduction in this input capacitance makes it possible to increase the speed of the successive approximation A/D converter.

BRIEF DESCRIPTION OF THE DRAWINGS

Other objects and further features of the present invention will be apparent from the following detailed description when read in conjunction with the accompanying drawings, in which:

FIG. 20 is a timing chart showing the timing of timing signals used in the circuit shown in FIG. 19;

FIG. 21 is a block diagram showing an example of the configuration of the successive approximation A/D converter according to the present invention;

DESCRIPTION OF THE PREFERRED EMBODIMENTS

In the following, embodiments of the present invention will be described with reference to the accompanying drawings.

Figure 1:
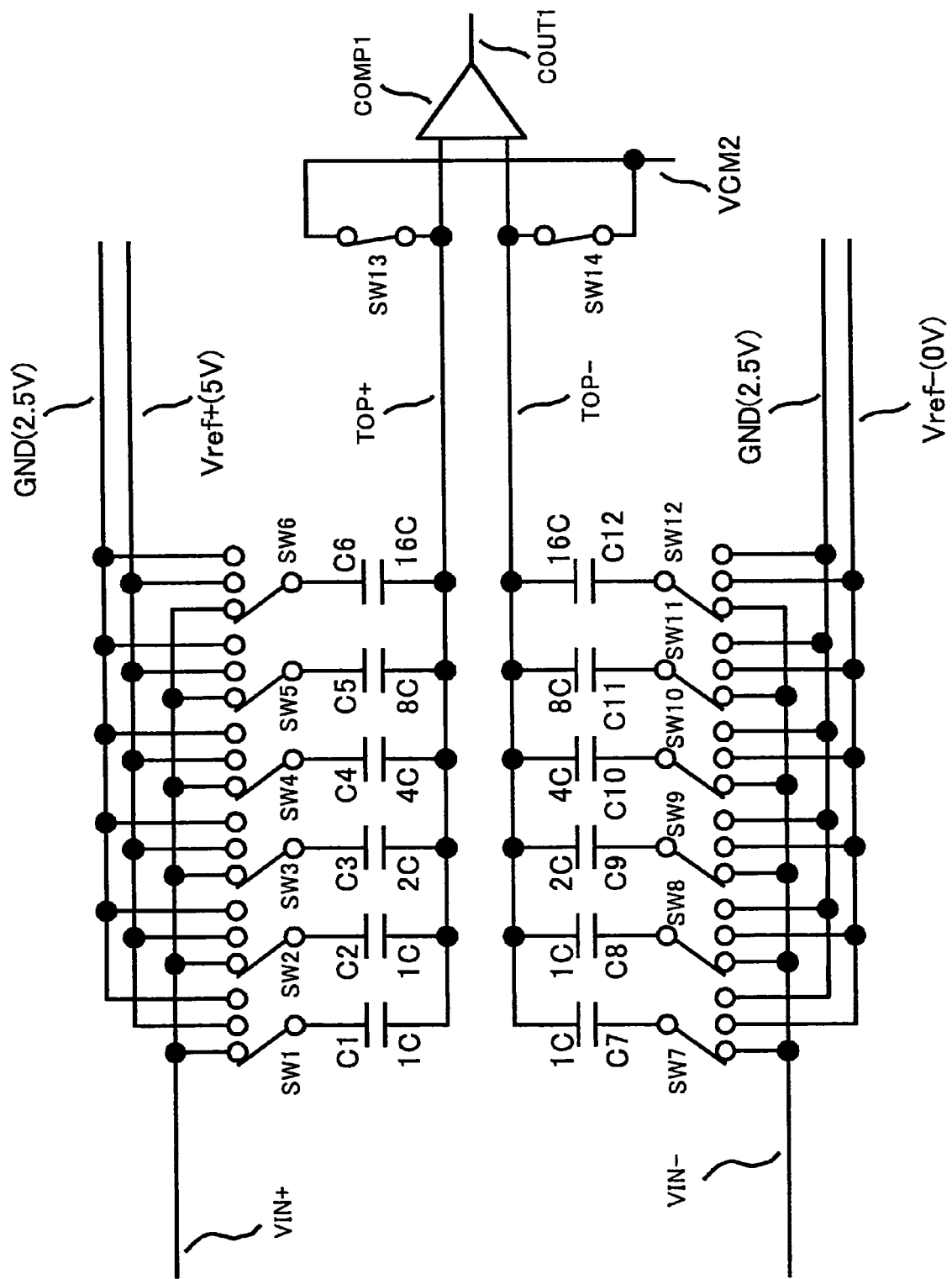
FIG. 1 is a drawing showing a differential switched capacitor DAC used in a related-art charge redistribution A/D converter.
Figure 2:
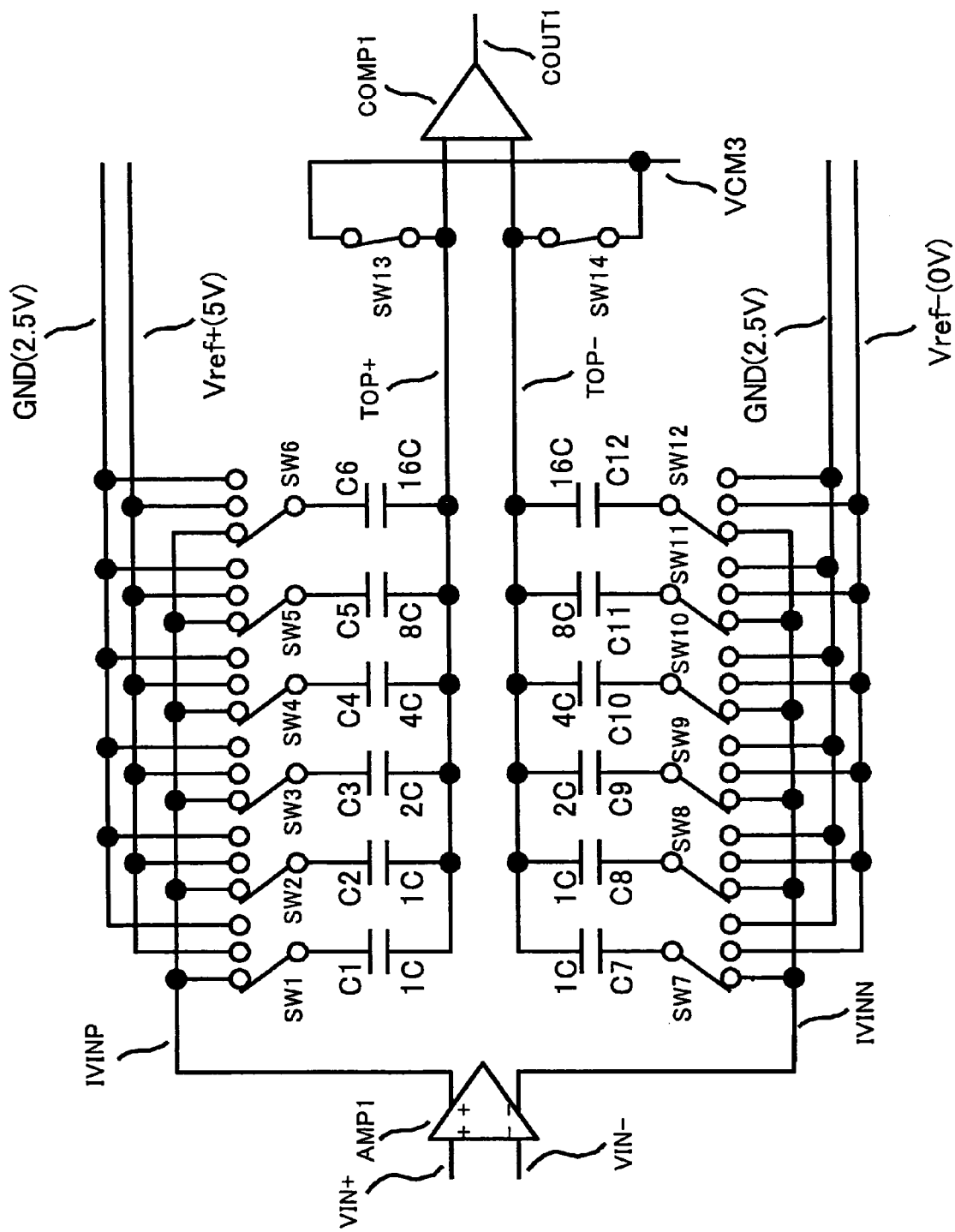
FIG. 2 is a drawing showing another circuit example of a successive approximation A/D converter.
Figure 3:
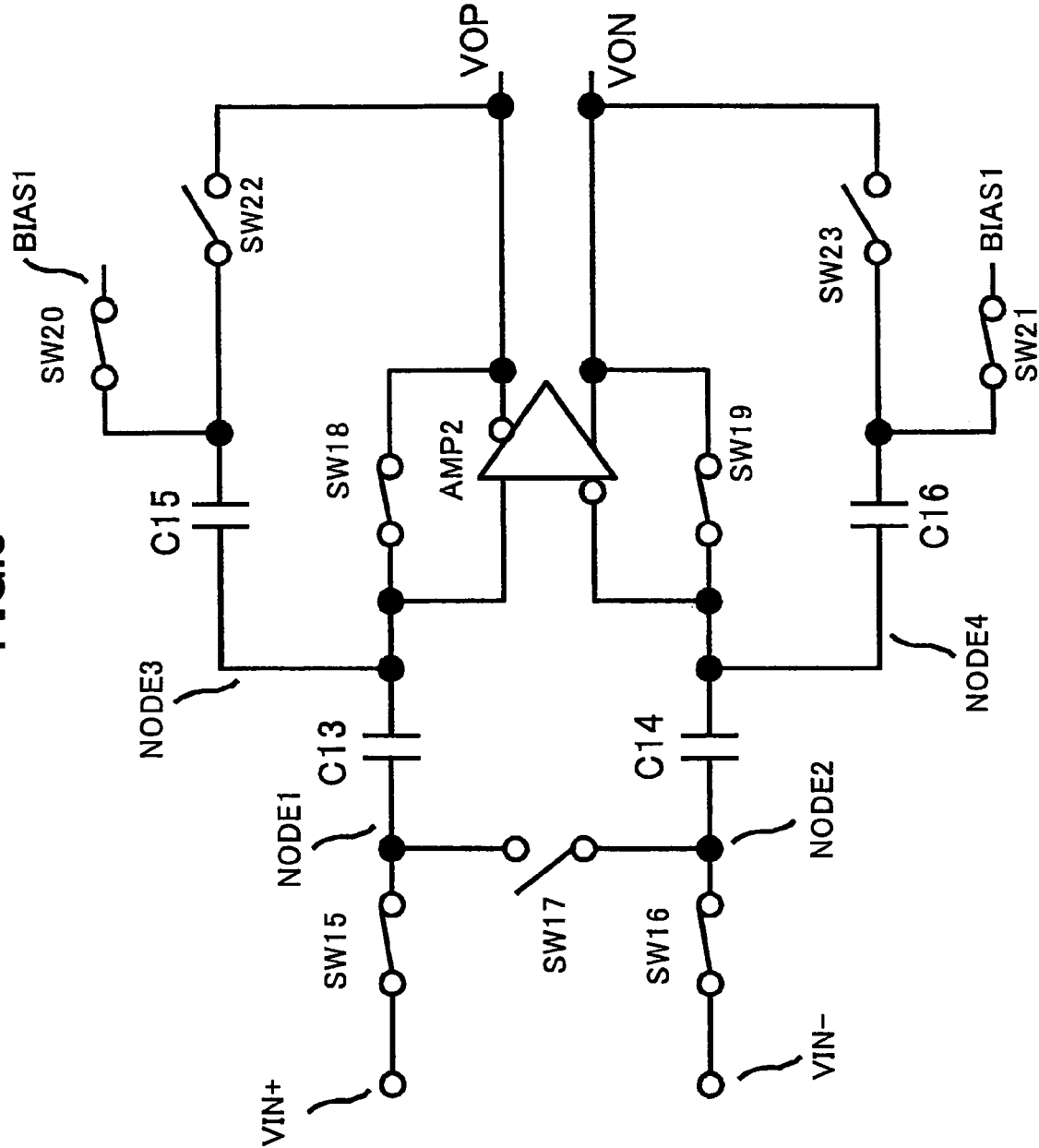
FIG. 3 is a drawing showing an example of the configuration of a related-art sample-hold amplifier circuit.
Figure 4:
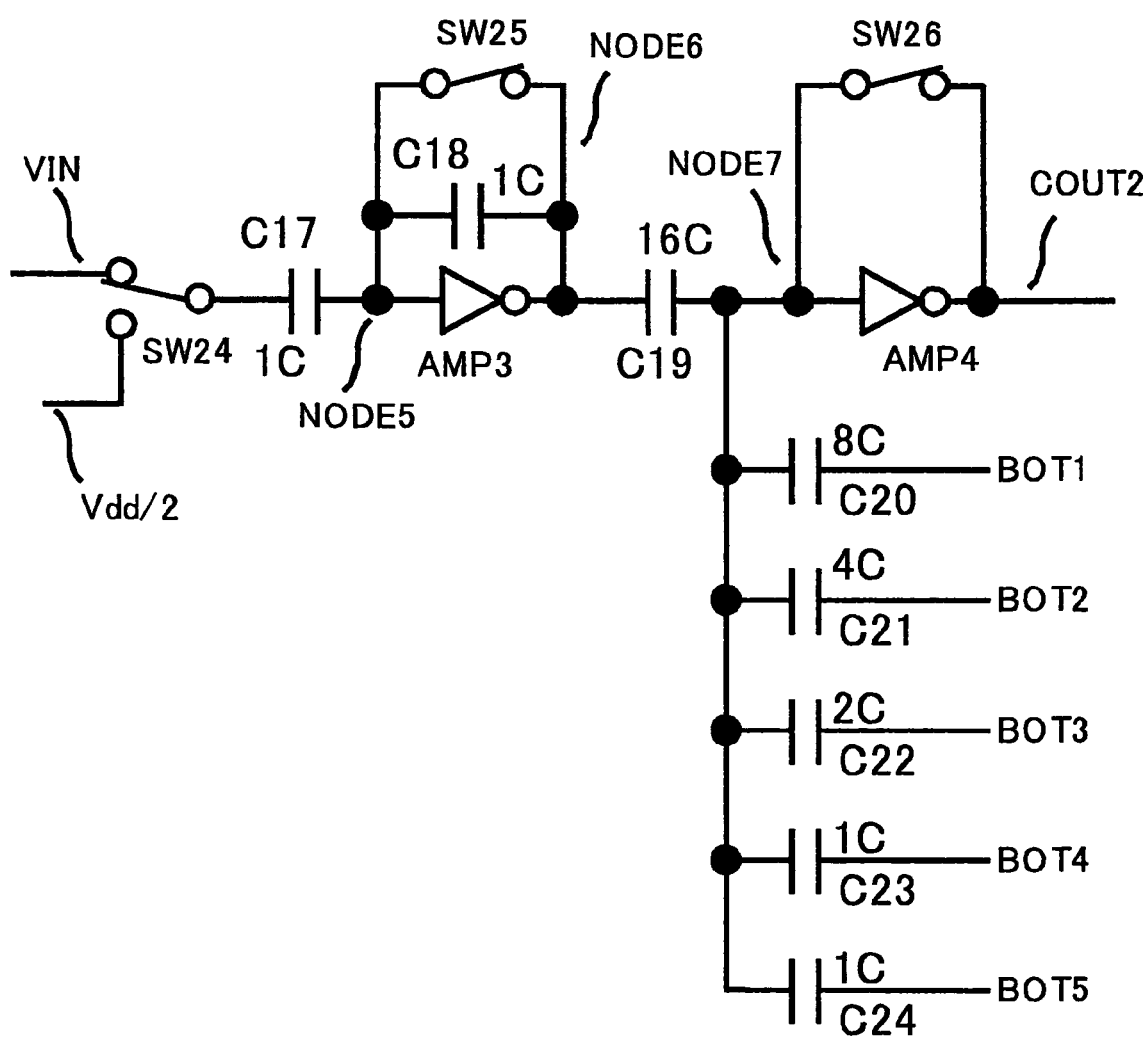
FIG. 4 is a drawing showing an example of a successive approximation A/D converter in which the function of a sample-hold amplifier is incorporated.
Figure 5A:
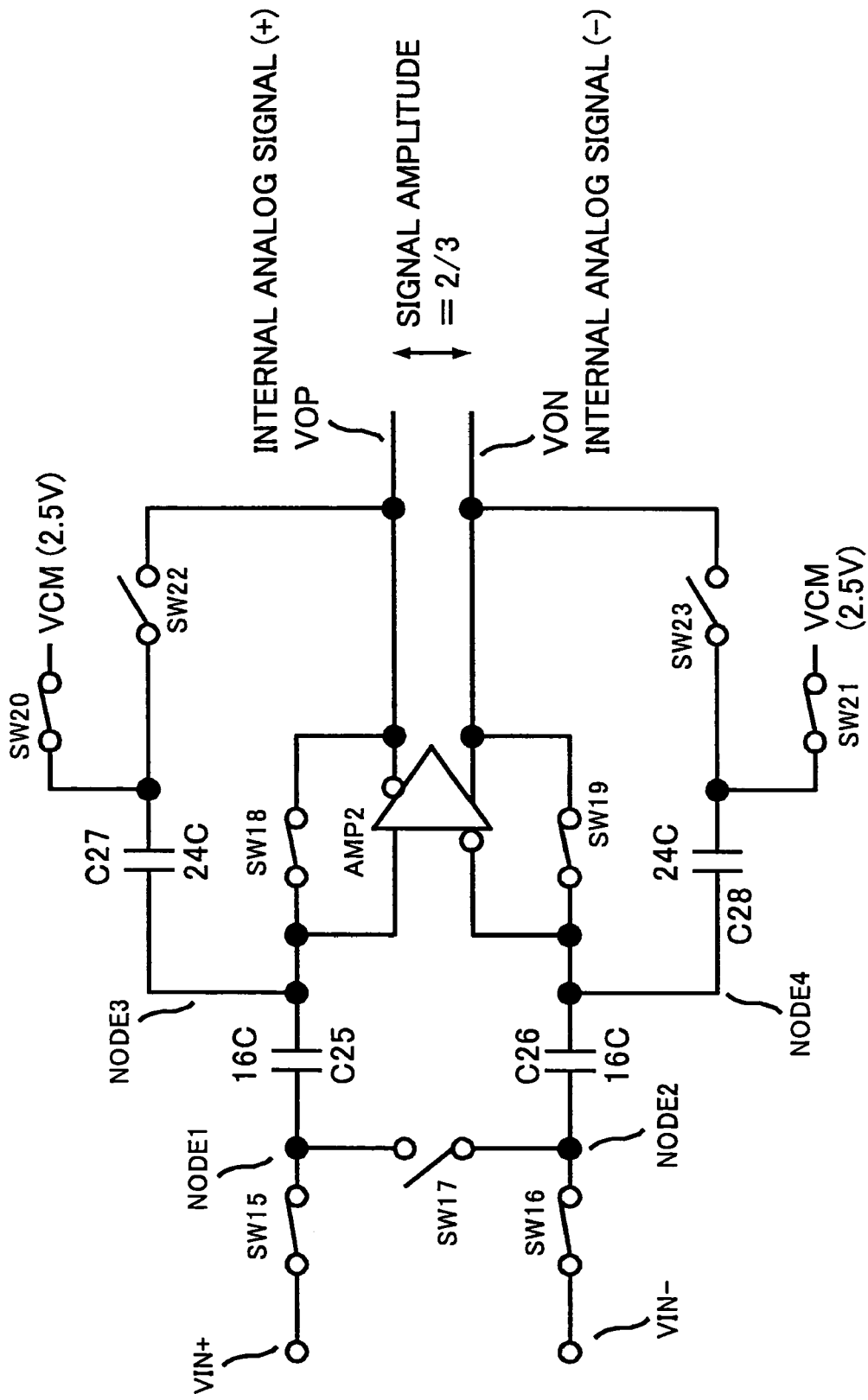
FIGS. 5A and 5B are circuit diagrams showing a first embodiment of a successive approximation A/D converter according to the present invention.
Figure 5B:
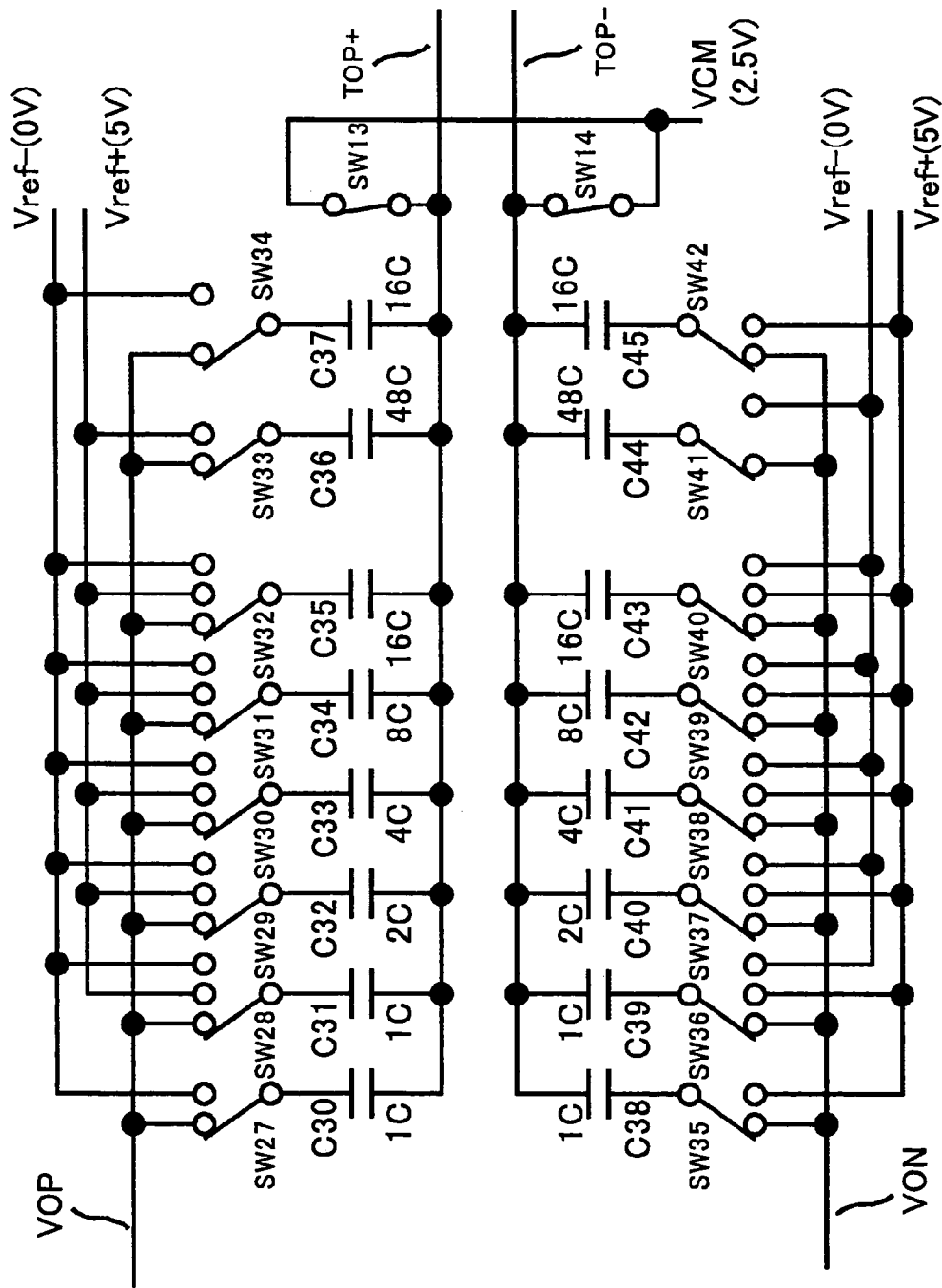

FIGS. 5A and 5B are circuit diagrams showing a first embodiment of a successive approximation A/D converter according to the present invention. FIG. 5A illustrates a circuit portion corresponding to a sample-hold amplifier circuit, and FIG. 5B illustrates a circuit portion corresponding to a capacitor array unit that is coupled to the output of the sample-hold amplifier circuit. The output of the capacitor array unit is coupled to a comparator in the same manner as shown in FIG. 1.

The circuit shown in FIGS. 5A and 5B includes switches SW13, SW14, SW15 through SW23, and SW27 through SW42, capacitors C25 through C28, capacitors C30 through C45, and an amplifier circuit AMP2. VIN+ is a plus-side analog input potential, and VIN− is a minus-side analog input potential. VOP and VON are plus-side and minus-side internal analog signals, respectively, which are the outputs of the sample-hold amplifier circuit. TOP+ indicates the plus-side top plate of the capacitor array, and TOP− indicates the minus-side top plate of the capacitor array. Moreover, Vref+ is a plus-side reference potential (5V), and Vref− is a minus-side reference potential (0V). Furthermore, VCM is a bias potential (e.g., 2.5 V) of the top plate at the time of sampling. NODE1 through NODE4 are internal nodes. A value kC (k is an integer) shown alongside each capacitor Cn (n is an integer) specifies the relative size of each capacitance.

The positions of the switches illustrated in FIG. 5A show their positions during the sampling operation of the sample-hold amplifier circuit. In the following, a description will be given of the sampling operation of the sample-hold amplifier circuit.

The switches SW18 and SW19 are closed so as to set NODE3 and NODE4 to a potential approximately equal to ½ of the power supply voltage Vdd. Moreover, the switches SW20 and SW21 are closed so as to supply the bias potential VCM (2.5 V) equal to ½ of the power supply voltage Vdd to the bottom plate of the capacitors C27 and C28. If the amplifier AMP2 has ideal characteristics, and the offset is 0, the potential of NODE3 and NODE4 is set to ½Vdd. At this time, no electric charge is stored in the capacitors C27 and C28 (i.e., electric charge stored in C27 and C28 is 0). If the amplifier AMP2 is not ideal, the potential of NODE3 and the potential of NODE4 are not equal to each other, and this potential difference is approximately equal to an offset voltage of the amplifier AMP2 as converted into input equivalent. The purpose of the potential VCM that is supplied to the bottom plate of the capacitors C27 and C28 is to store the offset voltage in the capacitors C27 and C28, followed by removing the effect of this offset voltage at a later time.

At the same time, the switch SW15 and the switch SW16 are closed so as to supply the potentials of VIN+ and VIN− to the bottom plates of the capacitors C25 and C26, respectively. If the amplifier AMP2 has ideal characteristics, the potentials of NODE3 and NODE4 are set equal to ½Vdd, so that the capacitors C25 and C26 store electric charge equivalent to the potential difference between VIN+ and VIN−.

With ½Vdd being expressed as VCM, electric charge Q25 stored in the top plate of the capacitor C25 is represented as follows.

$$Q25 = -16C((VIN+) - VCM) \quad (1)$$

By the same token, electric charge Q26 stored in the top plate of the capacitor C26 is represented as follows.

$$Q26 = -16C((VIN-) - VCM) \quad (2)$$

In the following, a description will be given of the operation by which a voltage is produced at the outputs VOP and VON by way of electric charge transfer.

The switches are manipulated after the sampling state as described above, thereby producing a desired output potential at the outputs VOP and VON by way of electric charge transfer. After the potential difference between VIN+ and VIN− is stored in the capacitors C25 and C26, the switches SW18 and SW19 are opened so as to place NODE3 and NODE4 (the top plates of the capacitors C25 through C28) in a floating state. Further, the switches SW20 and SW21 are opened to stop supplying the VCM potential to the bottom plates of the capacitors C27 and C28. Furthermore, the switches SW17, SW22, and SW23 are closed.

With this configuration, the potential of NODE1 and the potential of NODE2 become equal. The potential of NODE1 and the potential of NODE2 that are equal to each other are expressed as VCMB. Further, it is assumed that the voltage gain of AMP2 is sufficiently large, and that the potential of NODE3 and the potential of NODE4 can be regarded as staying at the potential VCM even after the sampling performed by the sample-hold amplifier circuit. The potential of NODE3 and NODE4 does not change from VCM, and the potential of NODE1 and NODE2 is VCMB. Since the electric charge of NODE3 and NODE4 is preserved, the following equation (3) is satisfied with respect to the capacitor C25.

$$-16C((VIN+) - VCM) = -16C(VCMB - VCM) - 24C(VOP - VCM) \quad (3)$$

Moreover, the following equation (4) is satisfied with respect to the capacitor C26.

$$-16C((VIN-) - VCM) = -16C(VCMB - VCM) - 24C(VON - VCM) \quad (4)$$

Here, the potential of the node VOP is represented as VOP, and the potential of the node VON is represented as VON. By subtracting the equation (3) from the equation (4), the following equations (5) and (6) are obtained.

$$-16C((VIN+) - (VIN-)) = -24C(VOP - VON) \quad (5)$$

$$16((VIN+) - (VIN-))/24 = (VOP - VON) \quad (6)$$

Namely, the electric charge is transferred from the capacitors C25 and C26 to the capacitors C27 and C28, thereby producing, at VOP and VON, a potential difference proportional to ((VIN+)−(VIN−)) that is the potential difference of the analog input signals. The voltage gain can be set smaller than 1 by adjusting the size of the capacitors C25, C26, C27, and C28. In this example, the gain is set to $16/24 (=2/3)$. In general, the gain can be set to n/m (n<m). Moreover, the control is performed such that the common potential of VOP and VON coincides with VCM.

In this manner, with the voltage gain of the sample-hold amplifier circuit being designed to be smaller than 1, the saturation of the output of the amplifier AMP2 can be avoided even when the potential difference between the analog input signals is equal to the power supply voltage. Accordingly, it is possible to cope with analog input signals having a potential difference equal to the power supply voltage, i.e, analog input signals varying over the rail-to-rail range.

In the following, a description will be given of a case in which the amplifier AMP2 is not ideal, with a non-negligible offset. The electric charge Q25 stored in the top plate of the capacitor C25 at the time of sampling is represented as:

$$Q25=-16C((VIN+)-VCMNODE3) \quad (7).$$

Here, VCMNODE3 is the potential of NODE3 at the time of sampling. By the same token, the electric charge Q26 stored in the top plate of the capacitor C26 is represented as:

$$Q26=-16C((VIN-)-VCMNODE4) \quad (8).$$

Here, VCMNODE4 is the potential of NODE4 at the time of sampling.

In this situation that is not ideal, electric charge is also stored in the top plate of the capacitors C27 and C28. These electric charges Q27 and Q28 are represented as:

$$Q27=24C(VCMNODE3-VCM) \quad (9).$$

$$Q28=24C(VCMNODE4-VCM) \quad (10).$$

After this sampling state, the switches are manipulated to transfer the electric charges, thereby producing desired output potentials at the outputs VOP and VON.

With this provision, the potential of NODE1 and the potential of NODE2 become equal. The potential of NODE1 and the potential of NODE2 that are equal to each other are expressed as VCMB. Further, it is assumed that the voltage gain of AMP2 is sufficiently large, and that the potential of NODE3 and the potential of NODE4 can be regarded as staying at the respective potentials VCMNODE3 and VCMNODE4 even after the sampling performed by the sample-hold amplifier circuit.

The potentials of NODE3 and NODE4 do not change from the respective potentials VCMNODE3 and VCMNODE4, and the potential of NODE1 and NODE2 is VCMB. Since the electric charge of NODE3 and NODE4 is preserved, the following equation (11) is satisfied with respect to NODE3.

$$-16C((VIN+)-VCMNODE3)+24C(VCMNODE3-VCM)=-16C(VCMB-VCMNODE3)-24C(VOP-VCMNODE3) \quad (11)$$

Moreover, the following equation (12) is satisfied with respect to NODE4.

$$-16C((VIN-)-VCMNODE4)+24C(VCMNODE4-VCM)=-16C(VCMB-VCMNODE4)-24C(VON-VCMNODE4) \quad (12)$$

Here, the potential of the node VOP is represented as VOP, and the potential of the node VON is represented as VON.

By subtracting the equation (12) from the equation (11), the following equations (13) and (14) are obtained.

$$-16C((VIN+)(VIN))+(16C)(VCMNODE3)+(24C)(VCMNODE3)-(16C)(VCMNODE4)-(24C)(VCMNODE4)=(16C)(VCMNODE3)+(24C)(VCMNODE3)-(16C)(VCMNODE4)-(24C)(VCMNODE4)-24C(VOP-VON) \quad (13)$$

$$16((VIN+)-(VIN-))/24=(VOP-VON) \quad (14)$$

Namely, even if the situation is not ideal with a nonnegligible offset, a sufficiently large voltage gain of the amplifier AMP2 can produce, at VOP and VON, a potential difference proportional to ((VIN+)-(VIN-)) that is the potential difference between the analog input signals. This is done by way of the transfer of electric charges to the capacitors C27 and C28 from the capacitors C25 and C26.

In the manner as described above, the sample-hold amplifier circuit produces, at the outputs VOP and VON, a potential difference proportional to ((VIN+)-(VIN-)) that is the potential difference between the analog input signals. The potential difference appearing at the outputs VOP and VON is then sampled by the switched capacitor DAC shown in FIG. 5B.

The positions of the switches illustrated in FIG. 5B show their positions during the sampling operation of the switched capacitor DAC that samples the outputs VOP and VON of the sample-hold amplifier circuit. In the following, a description will be given of the sampling operation of the switched capacitor DAC that samples the outputs VOP and VON of the sample-hold amplifier circuit.

The switches SW27 through SW34 are controlled such that the bottom plates of the capacitors C30 through C37 are coupled to VOP. Moreover, the switch SW13 is closed so as to supply VCM to the top plate (TOP+) of the capacitors C30 through of C37. That is, electric charge equivalent to a potential difference between VCM and VOP is stored in the capacitors C30 through C37.

The switches SW35 through SW42 are controlled such that the bottom plates of the capacitors C38 through C45 are coupled to VON. Moreover, the switch SW14 is closed so as to supply VCM to the top plate (TOP-) of the capacitors C38 through of C45. That is, electric charge-equivalent to a potential difference between VCM and VON is stored in the capacitors C38 through C45.

After the end of the sampling operation as described above, the switches SW13 and SW14 are opened. Also, the switches SW27 through SW32 and the switches SW35 through SW40 are manipulated such that the bottom plates of the capacitors C30 through C35 and the capacitors C38 through C43 (i.e., the end nodes of the capacitors on the side connected to SW27 through SW32 and SW35 through SW40) are selectively coupled to either Vref+ or Vref-. With this provision, a digital code corresponding to the sampled analog potential difference ((VIN+)-(VIN-)) is searched for.

As previously described, the voltage gain of the sample-hold amplifier circuit shown in FIG. 5A is set smaller than 1, so that there is a need to compensate for the reduction in the potential difference caused by this voltage gain. In the following, a description will be given of this compensation.

For the sake of simplicity of explanation, a specific example is used in which the power supply voltage Vdd is set to 5 V, the reference voltage Vref+ to 5 V, Vref- to 0 V, VCM to 2.5 V, VIN+ to 5 V, and VIN- to 0 V. A potential difference between the reference voltages Vref+(5V) and Vref-(0V), i.e., a potential difference equal to the power supply voltage 5V, may be input into VIN+ and VIN-. Even in this case, the output of the amplifier AMP2 shown in FIG. 5A should not saturate, so that the voltage gain used in the example of FIG. 5 is set to $\tfrac{2}{3}$(=n/m). Because of this, as shown in FIG. 6, the outputs VOP and VON of the sample-hold amplifier circuit have a signal amplitude that is $\tfrac{2}{3}$ of the power supply voltage centering at the bias potential VCM.

Figure 6:
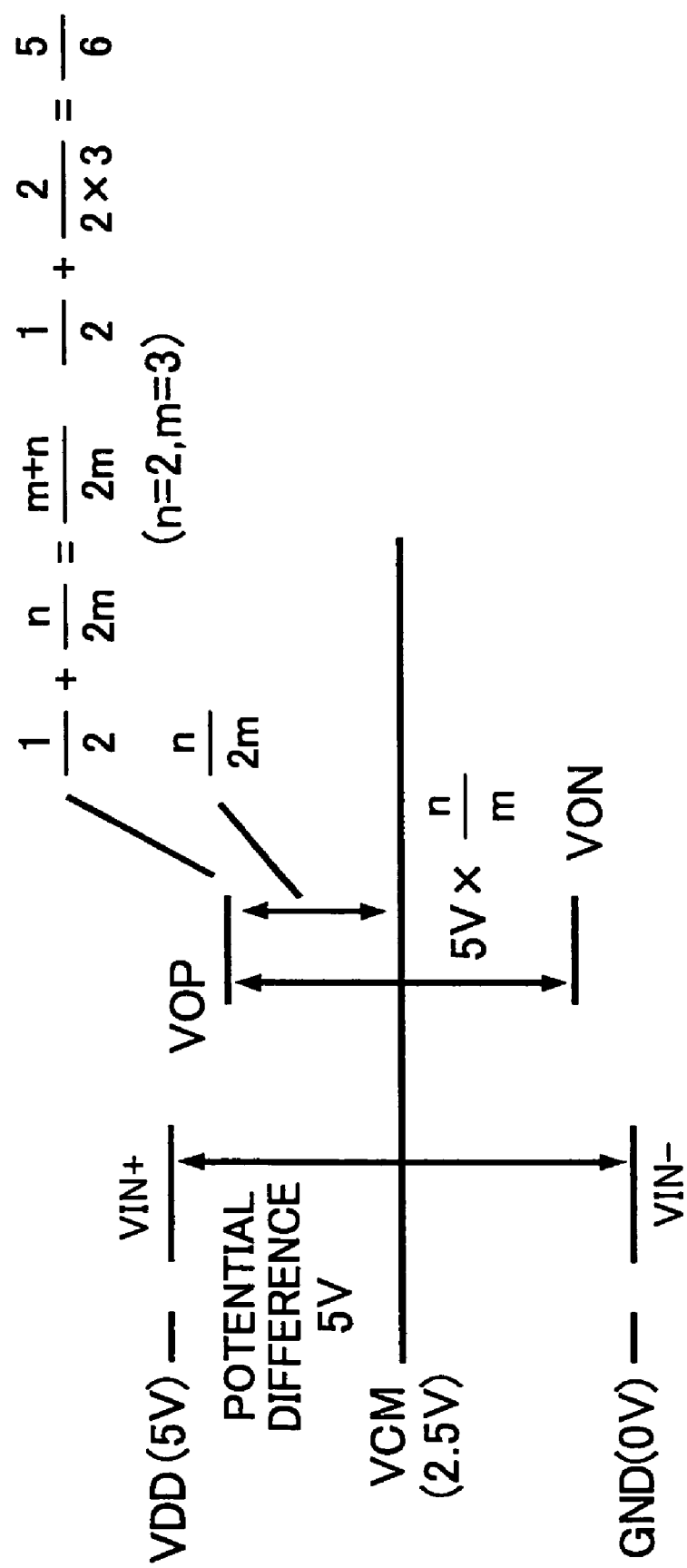
FIG. 6 is a drawing showing relationships between potentials appearing in the circuit shown in FIG. 5.
Figure 7:
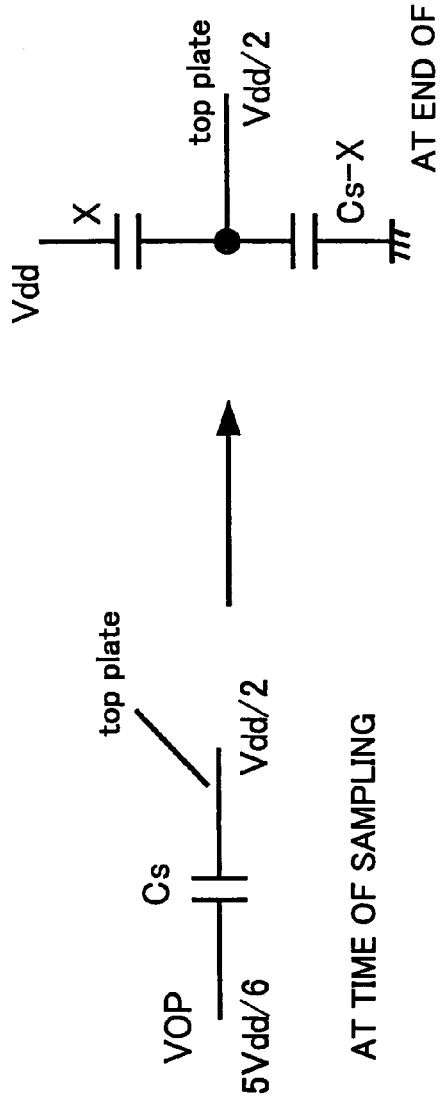
FIG. 7 is an illustrative drawing showing the outline of the operation of a plus-side switched capacitor DAC that samples the potential of VOP.

In the case of VIN+=5V and VIN-=0V, the potential of VOP is set to ($\tfrac{1}{2}$+n/2 m) (Vdd)=(5Vdd)/6 (n=2, m=3) as shown in FIG. 6. By the same token, the potential of VON is set to Vdd/6, producing a potential difference equal to 2Vdd/3. At the time of sampling by the switched capacitor DAC, the potentials of VOP and VON are sampled by the switched capacitor DAC. FIG. 7 is an illustrative drawing showing the outline of the operation of the plus-side switched capacitor DAC that samples the potential of VOP.

The left-hand side of FIG. 7 illustrates the operation of the plus-side switched capacitor DAC in the case of VIN+=5 V. At the time of sampling, the top plate (TOP+) of the switched capacitor DAC is set to VCM (=2.5 V), and the bottom plate is set to 5Vdd/6. Cs shown in FIG. 7 indicates a total of the sampling capacitances of the plus-side switched capacitor DAC (i.e., C30 through C37 shown in FIG. 5).

After the end of the sampling, the potential of the bottom plate is set to either Vref+(5V) or Vref−(0V). With this, a digital code that makes the potential of the bottom plate equivalent to VOP is searched for, and the identified digital code is used as the result of AD conversion. What is shown as X on the right-hand side of FIG. 7 is a total of the capacitances whose bottom plates are coupled to Vref+(5V)=Vdd among the total capacitance Cs at the end of the conversion. A total of the capacitances whose bottom plates are coupled to Vref−(0V) is Cs−X. The circuit is designed such that the potential of the top plate of the plus-side switched capacitor DAC at the end of the conversion is equal to VCM=2.5 V, which is the potential of the top plate at the time of sampling.

The minus-side DAC is designed such that it operates in a symmetrical manner with VCM at the center of the potential range, with Vref+ of the plus-side switched capacitor DAC being replaced with Vref−, and Vref− being replaced with Vref+. This makes it possible to design the circuit such that the potential (TOP+) of the top plate of the plus-side switched capacitor DAC is equal to the potential (TOP−) of the top plate of the minus-side switched capacitor DAC at the end of the conversion.

When X is smaller than its final value in FIG. 7, the potential of the plus-side top plate is smaller than its final value, and the potential of the minus-side top plate is larger than its final value. This potential difference is detected by a comparator, thereby increasing X at the next comparison cycle in an attempt to bring the potential difference between the two top plates closer to zero. This operation is performed by checking which one of TOP+ and TOP− shown in FIG. 5 is larger by supplying TOP+ and TOP− to the comparator.

When X is larger than its final value in FIG. 7, the potential of the plus-side top plate is larger than its final value, and the potential of the minus-side top plate is smaller than its final value. This potential difference is detected by the comparator, thereby decreasing X at the next comparison cycle in an attempt to bring the potential difference between the two top plates closer to zero. In this manner, a desired redistribution of capacitances is searched for while detecting a potential difference between the top plates, thereby determining the A/D conversion result.

Figure 8:
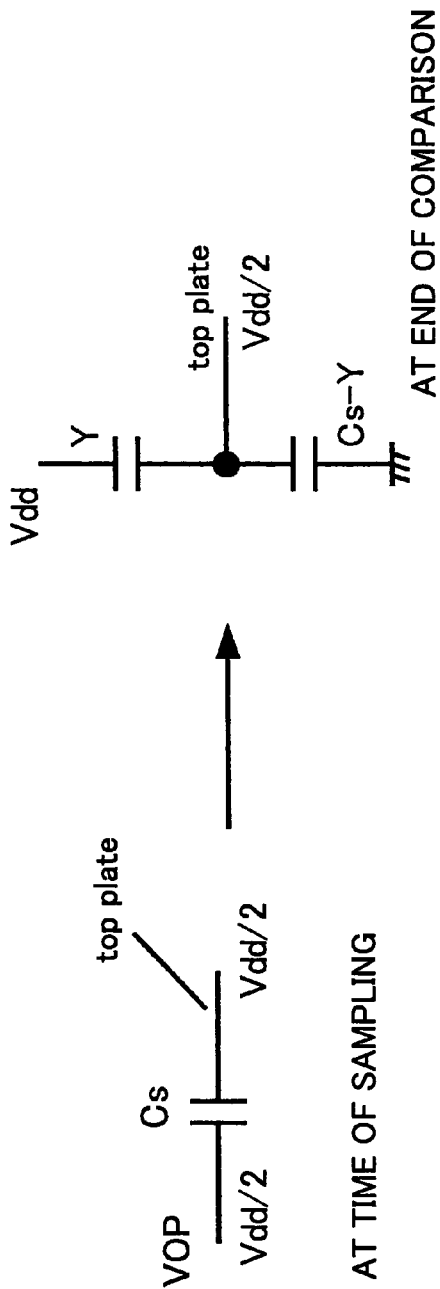
FIG. 8 is an illustrative drawing showing the outline of the operation of the plus-side switched capacitor DAC in the case of VIN+=VIN-=VCM.

FIG. 8 is an illustrative drawing showing the outline of the operation of the plus-side switched capacitor DAC in the case of VIN+=VIN−=VCM. In the case of VIN+=VIN−=VCM, VOP=VON=VCM=Vdd/2=2.5V is satisfied, so that the bottom plate of the switched capacitor DAC at the time of sampling is set to Vdd/2. The top plate (TOP+) of the switched capacitor DAC at the time of sampling is set to VCM=2.5V.

The right-hand side of FIG. 8 illustrates the connections of the capacitances at the end of conversion. What is shown as Y is a total of the capacitances whose bottom plates are coupled to Vref+(5V)=Vdd among the total capacitance Cs at the end of the conversion. A total of the capacitances whose bottom plates are coupled to Vref−(0V) is Cs−X. The circuit is designed such that the potential of the top plate of the plus-side switched capacitor DAC at the end of the conversion is equal to VCM=2.5 V, which is the potential of the top plate at the time of sampling. The minus-side DAC is designed such that it operates in a symmetrical manner with VCM at the center of the potential range, with Vref+ of the plus-side switched capacitor DAC being replaced with Vref−, and Vref− being replaced with Vref+. This is the same as what has already been described.

Figure 9:
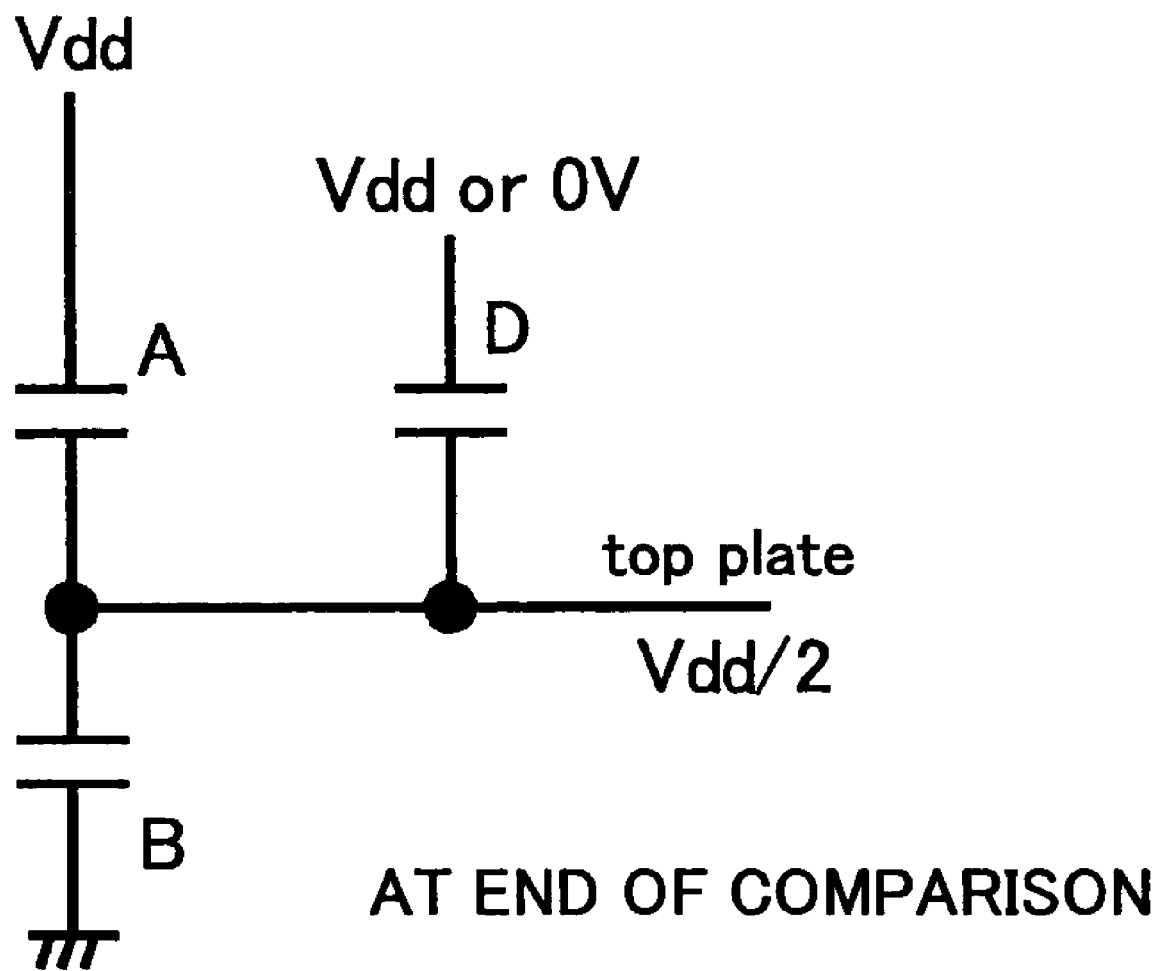
FIG. 9 is an illustrative drawing showing the distribution of capacitances in the plus-side switched capacitor DAC.

As can be understood from FIG. 8, Y becomes Cs/2 if the voltage gain n/m=⅔(n=2, m=3). FIG. 9 is an illustrative drawing showing the distribution of capacitances in the plus-side switched capacitor DAC.

In FIG. 9, "A" indicates a total of the capacitances whose bottom plates are coupled to Vref+(5 V)=Vdd regardless of the code input for comparison. In FIG. 9, "B" indicates a total of the capacitances whose bottom plates are coupled to Vref−=0 V regardless of the code input for comparison. The remaining "D" indicates a total of the capacitances whose bottom plates are selectively coupled to Vref+(5 V)=Vdd or Vref−=0 V in response to the code input for comparison.

By comparing FIG. 9, FIG. 8, and FIG. 7, A, B, and D of FIG. 9 can be determined. Since FIG. 8 is directed to the case where VIN+=VIN−=VCM, a potential difference between VIN+ and VIN− is 0. As a result, the final input code of the plus-side switched capacitor DAC is comprised of all zeros in all the bits. Namely, when the potential difference between VIN+ and VIN− is 0, all of D shown in FIG. 9 is connected to Vref−=0 V. Since Y must be Cs/2 as can be seen from FIG. 8, A should be Cs/2.

As shown in FIG. 7, X is equal to 5Cs/6 in the case of VOP=5Vdd/6. The design is made such that the final input code of the plus-side switched capacitor DAC is a full-scale code (all the bits are "1") when A=Cs/2 and VOP=5Vdd/6. Thus, it can be ascertained that B=Cs/6. As a result, the capacitance portion "D" indicative of the capacitances whose bottom plates are selectively coupled to Vref+(5 V)=Vdd or Vref−=0 V in response to the input code of the switched capacitor DAC is equal to Cs−Cs/2−Cs/6=Cs/3.

Referring to FIG. 5 again, FIG. 5 illustrates an example in which the switched capacitor DAC is 5 bits. When a 5-bit switched capacitor DAC with the most basic configuration having binary weighting is to be implemented, it is general to set C30 and C31 to 1C, C32 to 2C, C33 to 4C, C34 to 8C, and C35 to 16C. Since this portion corresponds to the portion D shown in FIG. 9, a total capacitance 32C of this portion is equal to Cs/3 as derived above. Namely, with Cs/3=32C, the capacitance of each portion can be determined such that Cs=96C, A=Cs/2=48C, and B=Cs/6=16C.

The capacitance portion A=48C whose bottom plates are coupled to Vref+(5 V)=Vdd regardless of the input code for comparison is shown as the capacitor C36 in FIG. 5B. Further, the capacitance portion B=16C whose bottom plates are coupled to Vref−=0 V regardless of the input code for comparison is shown as the capacitor C37.

After the sampling of the potentials of VOP and VON, the switches SW13 and SW14 are opened to place TOP+ and TOP− in a floating state, followed by starting a comparison operation by the comparator. In doing so, the switch SW33 is operated to couple the bottom plate of the capacitor C36 to Vref+(5 V) Further, the switch SW34 is operated to couple the bottom plate of the capacitor C37 to Vref−=0 V. In a symmetrical manner on the minus side, the bottom plate of the capacitor C44 is coupled to Vref−=0 V, and the bottom plate of the capacitor C45 is coupled to Vref+(5 V).

In response to the input code of the switched capacitor DAC, the bottom plates of the capacitors C30 through C35 are selectively coupled to Vref+(5 V) or Vref−(0 V). If the input code of the switched capacitor DAC is 01000, for example, the bottom plates of the capacitors C35, C33, C32, C31, and C30 are coupled to Vref−=0 V, and the bottom plate of the capacitor C34 is coupled to Vref+(5 V). On the minus-side DAC, operations are symmetric to this. That is, if the input code of the switched capacitor DAC is 01000, the bottom plates of the capacitors C43, C41, C40, C39, and C38 are coupled to Vref+(5 V), and the bottom plate of the capacitor C42 is coupled to Vref−(0 V).

The input code given to the DAC is successively changed to search for a digital code that minimizes the potential difference between TOP+ and TOP−. The identified digital code is used as the result of the A/D conversion.

As was described during the course of obtaining A and B of FIG. 9, the potential of VOP is (½+n/2 m) (Vdd)=5Vdd/6 (n=2, m=3) in the case of VIN+=5V and VIN−=0V. With the capacitor C36 being set to 48C and the capacitor C37 to 16C (also the capacitor C44 to 48C and the capacitor C45 to 16C), the potential of TOP+ and the potential of TOP− are set almost equal to each other by coupling the bottom plates of the capacitors C31 through C35 to Vref+(5 V) and by coupling the bottom plates of the capacitors C39 through C43 to Vref−(0 V). Accordingly, even though the voltage gain of the sample-hold amplifier circuit is set to n/m=⅔, the digital converted value "11111" can be obtained.

In this configuration, the capacitors C36, C37, C44, and C45 serve as a (voltage) scaling circuit that converts the (maximum) values of VOP and VON into the full-scale values of the switched capacitor DAC. By the same token, it is possible to demonstrate that a proper operation can be performed in the same manner as described above in the case of VIN+=VIN−=VCM.

As described above, the circuit shown in FIG. 5 is provided with the sample-hold amplifier circuit having the voltage gain smaller than 1 and the switched capacitor DAC for sampling the potentials of its outputs VOP and VON. Further, the capacitors (C36, C37, C44, C45) are provided to adjust (change the scale of) the digital output of the A/D converter such that the output of the sample-hold amplifier circuit responding to the inputting of the reference voltage (i.e., the potential difference between Vref+ and Vref−) into the sample-hold amplifier circuit corresponds to the maximum value of the digital output of the A/D converter. With this provision, a potential difference proportional to the analog input potential difference can be supplied from the amplifier circuit to the switched capacitor DAC even when the reference voltage (i.e., the potential difference between Vref+ and Vref−) and the analog input potential difference are both equal to the power supply voltage. Further, the voltage gain that is smaller than 1 is compensated for, thereby producing a proper digital output value.

Further, provision is made to use the sample-hold amplifier circuit to sample the analog signals. This makes it possible to design a small input capacitance of the sample-hold amplifier circuit independently of the switched capacitor DAC. Reduction in this input capacitance serves to increase the speed of the successive approximation A/D converter.

The description provided in connection with FIG. 5 has been given of an example in which the voltage gain is n/m=⅔. It is apparent that a circuit operating based on the same principle can also be designed for a different voltage gain.

Figure 10:
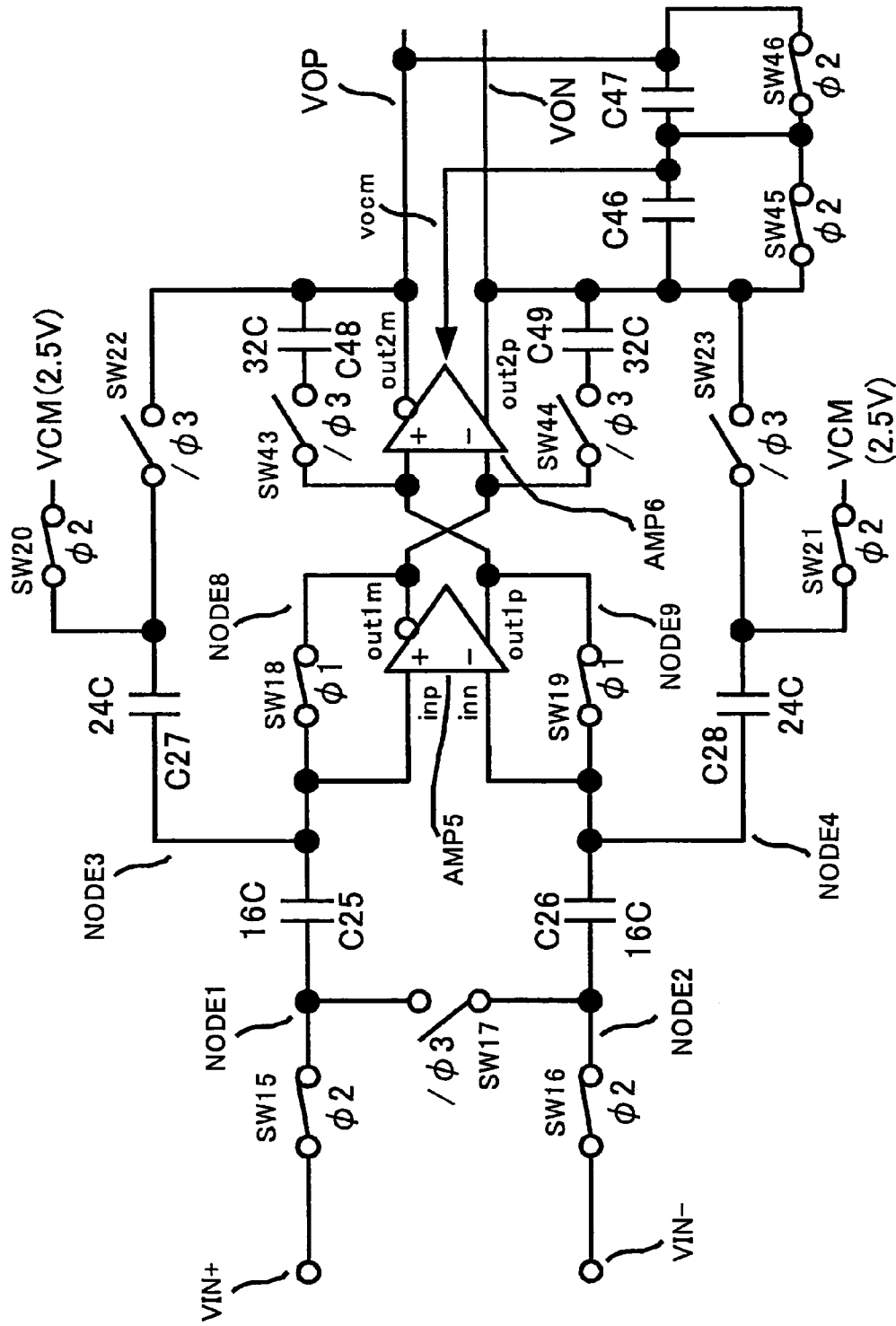
FIG. 10 is a drawing showing an example of a more specific circuit configuration of the sample-hold amplifier circuit shown in FIG. 5A.

FIG. 10 is a drawing showing an example of a more specific circuit configuration of the sample-hold amplifier circuit shown in FIG. 5A. In FIG. 10, the same elements as those of FIG. 5A are referred to by the same numerals, and a description thereof will be omitted.

Figure 11:
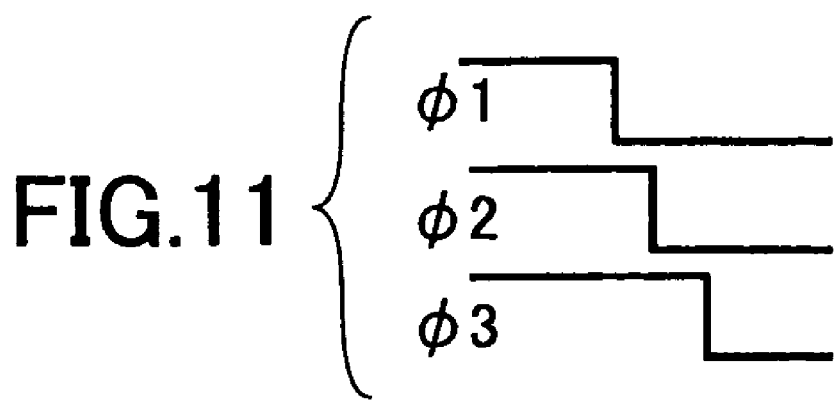
FIG. 11 is a signal timing chart showing timing signals used in the sample-hold amplifier circuit shown in FIG. 10.

The circuit shown in FIG. 10 includes the switches SW15 through SW23, switches SW43 through SW46, the capacitors C25 through C28, capacitors C46 through C49, and amplifier circuits AMP5 and AMP6. VIN+ indicates a plus-side analog input, and VIN− indicates a minus-side analog input. VOP and VON are a plus-side output and a minus-side output (internal analog signal (+), internal analog signal (−)), respectively, of the sample-hold amplifier circuit. VCM is a bias potential (e.g., 2.5V) applied to the bottom plates of the capacitors C27 and C28 at the time of sampling. Moreover, NODE1, through NODE4, NODE8 and NODE9 are internal nodes. vocm is a common potential of VOP and VON. Furthermore, φ1, φ2, and φ3 are timing signals shown in FIG. 11, and are used to control the opening and closing of respective switches. A value kC (k is an integer) shown alongside each capacitor Cn (n is an integer) specifies the relative size of each capacitance.

In FIG. 5A, the amplifier circuit was given as a single amplifier AMP2. As shown in FIG. 10, alternatively, the amplifier circuit can be implemented as divided circuits AMP5 and AMP6. The positions of the switches illustrated in FIG. 10 show their positions at the time of sampling the potentials VIN+ and VIN−. In the following, a description will be given of this sampling operation.

At the time of sampling, φ1 is H. The switches beside which φ1 and φ2 are shown are closed, and the switches beside which /φ3 is shown are open. In the same manner as described in connection with FIG. 5A, SW15 and SW16 are closed at the time of sampling to supply the potentials VIN+ and VIN− to the bottom plates (NODE1 and NODE2) of C25 and C26, respectively. The circuit of FIG. 10 differs from the circuit of FIG. 5A in that the potentials at NODE3 and NODE4 serve as the outputs NODE8 and NODE9 of AMP5 through SW18 and SW19, respectively. The outputs of the amplifier are input into the inputs thereof via SW18 and SW19, thereby storing the offset voltage, which was described in connection with FIG. 5A. When the outputs of the amplifier are supplied to the inputs thereof, a feedback loop is created. Design must thus be made such that the gain and phase characteristics are stable against oscillation. In the description provided in connection with FIG. 5A, it was assumed that the voltage gain of AMP2 is sufficiently large. In practice, however, it may be difficult sometimes to achieve both the stability of the loop and the sufficiently large voltage gain at the same time.

In such a case, AMP2 of FIG. 5A may be divided into AMP5 and AMP6 as shown in FIG. 10. When transferring output potentials to VOP and VON, the voltage gain of the portion corresponding to AMP2 of FIG. 5A must be sufficiently large. With consideration being given to this point, the circuit is designed such that the product of the voltage gain of AMP5 and the voltage gain of AMP6 determines the overall gain. During the feedback operation that supplies potentials to NODE3 and NODE4, the outputs of AMP5 are supplied to NODE 3 and NODE4 via SW18 and SW19, respectively. With this provision, it suffices if the gain and phase characteristics of AMP5 are stable with respect to the feedback at the time of sampling. This makes it possible to achieve loop stability independently of the gain and phase characteristics of AMP6.

In the circuit of FIG. 10, the outputs of AMP5 having a relatively small gain (compared to AMP2 shown in FIG. 5A)

are supplied to NODE3 and NODE4 via SW18 and SW19, respectively. It is thus easy to ensure loop stability. Further, provision is made to perform feedback control such that the common potential of NODE8 and NODE9 is set close to VCM, so that the potentials of NODE8 and NODE9 at the time of sampling are set to VCM under ideal circumstances. This will be described later in detail.

Since the potentials of NODE8 and NODE9 are set approximately to VCM at the time of sampling performed by the sample-hold amplifier circuit, VOP and VON are also set approximately to VCM (assuming that VOP and VON are subjected to feedback control such that their common potential is set to VCM). Since SW45 and SW46 are closed, vocm receives a middle potential between the potentials of VOP and VON.

In the following, a description will be given of the operation that outputs potentials to VOP and VON after the end of sampling in the circuit shown in FIG. 10.

After supplying a potential approximately equal to VCM to NODE3 and NODE4 to store electric charge in C25, C26, C27, and C28, SW18 and SW19 are opened. This results in NODE3 and NODE4 being placed in a floating state, so that the electric charges of NODE3 and NODE4 are preserved. Thereafter, SW20 and SW21 are opened, and SW45 and SW46 are also opened. As a result of opening of SW45 and SW46, the potential at vocm is set to the common potential of VOP and VON, which is obtained by dividing the potentials at VOP and VON through the capacitors C46 and C47. Here, C46 and C47 have capacitances equal to each other, and have the top plate thereof coupled to vocm.

SW17 is closed, and SW43, SW44, SW22, and SW23 are closed. As a result of the closing of SW43 and SW44, C48 is coupled between the output NODE9 of the first-stage amplifier and VOP, and C49 is coupled between the output NODE8 of the first-stage amplifier and VON. These capacitors serve in the same manner as the mirror compensation capacitors provided for the second-stage amplifier, and function as mirror capacitors to ensure loop stability. Although C48 and C49 are shown in this example as having size equal to 32C, it should be noted that the sizes of these capacitors need to be determined by taking into account load capacitance in order to maintain loop stability. As a result of the closing of SW22 and SW23, the electric charges of NODE3 and NODE4 are preserved, and the potentials at VOP and VON are determined such that the potentials of NODE3 and NODE4 serve as virtual ground points. This is the same as in the case of the circuit shown in FIG. 5A.

Implementing AMP2 of FIG. 5A as divided amplifiers AMP5 and AMP6 as shown in the circuit of FIG. 10 brings about an advantage in that it is easier to achieve a stable loop design.

Figure 12:
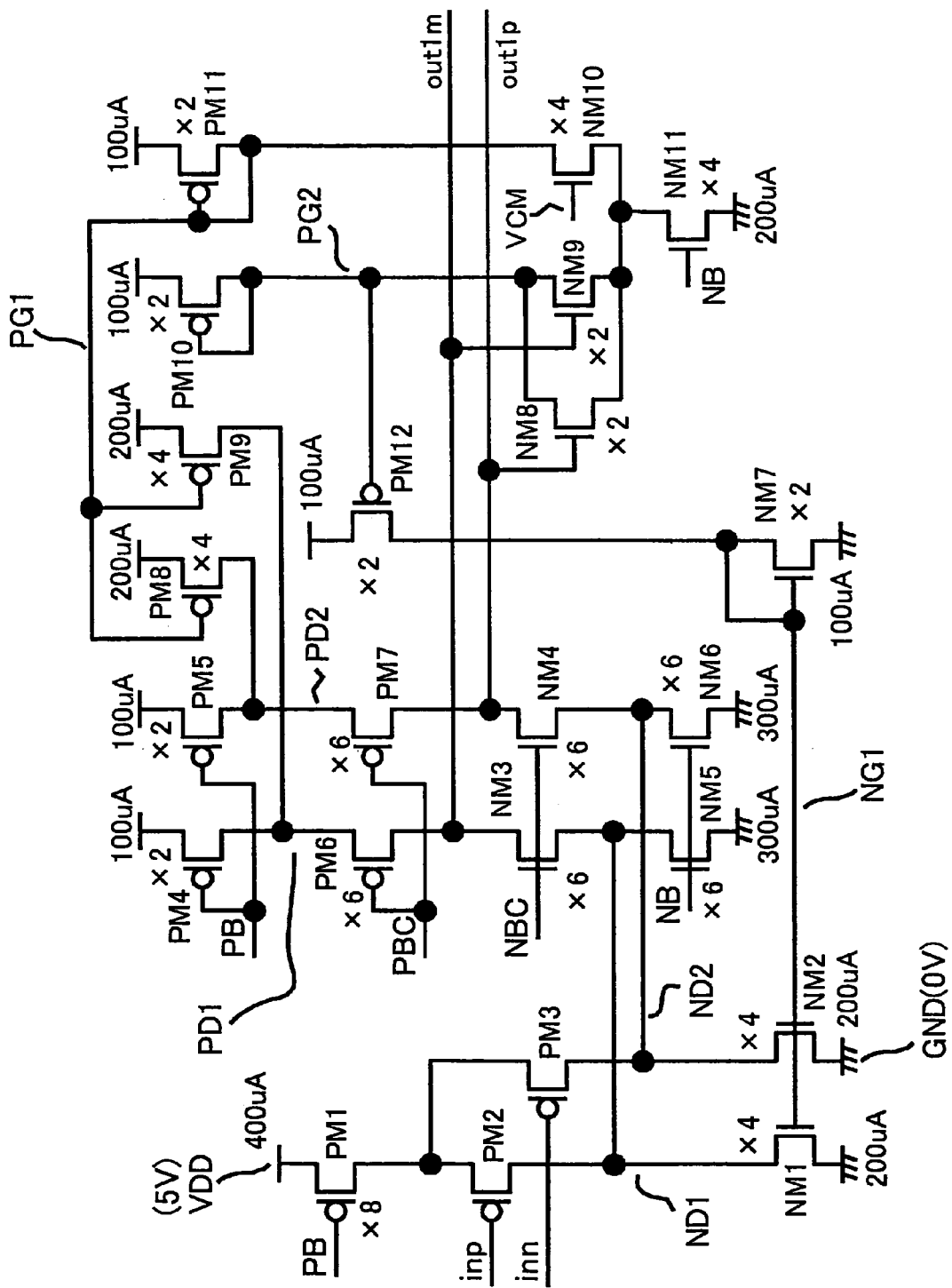
FIG. 12 is a circuit diagram of a first stage amplifier shown in FIG. 10 as illustrated at the transistor level.

FIG. 12 is a circuit diagram of AMP5 of FIG. 10 at the transistor level. The circuit shown in FIG. 12 includes PMOS transistors PM1 through PM12, NMOS transistors NM1 through NM11. VDD is a positive power supply voltage (e.g., 5 V), and GND is 0 V. "inp" and "inn" indicate inputs to the amplifier, and "out1$m$" and "out1$p$" indicate outputs of the amplifier. NB and NBC are bias potentials applied to the NMOS transistors, and PB and PBC are bias potentials applied to the PMOS transistors. VCM is a common potential input for the purpose of a common mode feedback. ND1, ND2, PD1, PD2, PG1, PG2, and NG1 indicate internal nodes of the amplifier. "xd" (d: integer) shown alongside each MOS transistor demonstrates an example of the relative size of the corresponding MOS transistor. The value of an electric current shown alongside each circuit branch demonstrates an example of the amount of the corresponding electric current.

In FIG. 12, the circuit nodes and circuit elements corresponding to the circuit nodes and circuit elements shown in FIG. 10 are referred to by the same numerals. Functions necessary for AMP5 of FIG. 10 is to produce the outputs out1$m$ and out1$p$ and to control the common potential of these output potentials to make it equal to VCM, for example. In the following, these operations will be described.

The circuit shown in FIG. 12 is implemented by combining a common mode feedback circuit with a folded cascode circuit. The folded cascode circuit is comprised of PM1, PM2, PM3, PM4, PM5, PM6, PM7, NM3, NM4, NM5, and NM6. The remaining circuit portion constitutes the common mode feedback circuit. The folded cascode circuit serves to amplify a potential difference between the inputs inp and inn, thereby producing an amplified potential difference at the outputs out1$m$ and out1$p$.

The folded cascode circuit is widely known, and a description thereof will be omitted. In the following, the operation of the attached common mode feedback circuit will be described. The output potentials out1$p$ and out1$m$ are applied to the gates of NM8 and NM9, respectively. Together with these, NM10 receiving VCM at the gate thereof constitute a differential circuit. At the time of sampling performed by the sample-hold amplifier circuit, the potentials out1$m$ and out1$p$ are substantially equal to each other. The following description will thus be provided with respect to the case in which the potentials out1$m$ and out1$p$ are equal to each other. If the potentials out1$m$ and out1$p$ are equal to the potential VCM, PM10 and PM11 allow the same amount of currents to flow. In the example shown in FIG. 12, an electric current of 100 μA runs through each of PM10 and PM11. Since an electric current of 100 μA runs through PM11, each of PM8 and PM9 allows an electric current of 200 μA to run therethrough. Since an electric current of 100 μA runs through PM10, each of NM1 and NM2 allows an electric current of 200 μA to run therethrough.

An electric current of 200 μA is supplied from each of PM8 and PM9, and an electric current of 200 μA flows through each of NM1 and NM2. In this case, therefore, PM8, PM9, NM1, and NM2 do not affect the potentials out1$m$ and out1$p$. In order to provide these electric currents, the sizes of PM6, PM7, NM3, and NM4 are changed from those of the normal folded cascode circuit to account for the increases in the electric currents.

If the potentials out1$m$ and out1$p$ are lower than the potential VCM, a large electric current flows through NM10. This results in the electric currents of PM8 and PM9 being larger than the electric currents of NM1 and NM2. Accordingly, the potentials out1$m$ and out1$p$ will rise. If the potentials out1$m$ and out1$p$ are higher than the potential VCM, the electric current flowing through NM10 decreases. As a result, the electric currents of NM1 and NM2 become larger than the electric currents of PM8 and PM9.

In this manner, the feedback function of the common mode potential makes the circuit operate in such a manner that the common mode potential of the output potentials out1$m$ and out1$p$ coincides with VCM. As described above by use of an example, the circuit configuration as shown in FIG. 12 provides a specific implementation of AMP5 shown in FIG. 10. Based on similar principles, AMP6 shown in FIG. 10 can be implemented as a specific circuit configuration, which is shown in FIG. 13.

Figure 13:
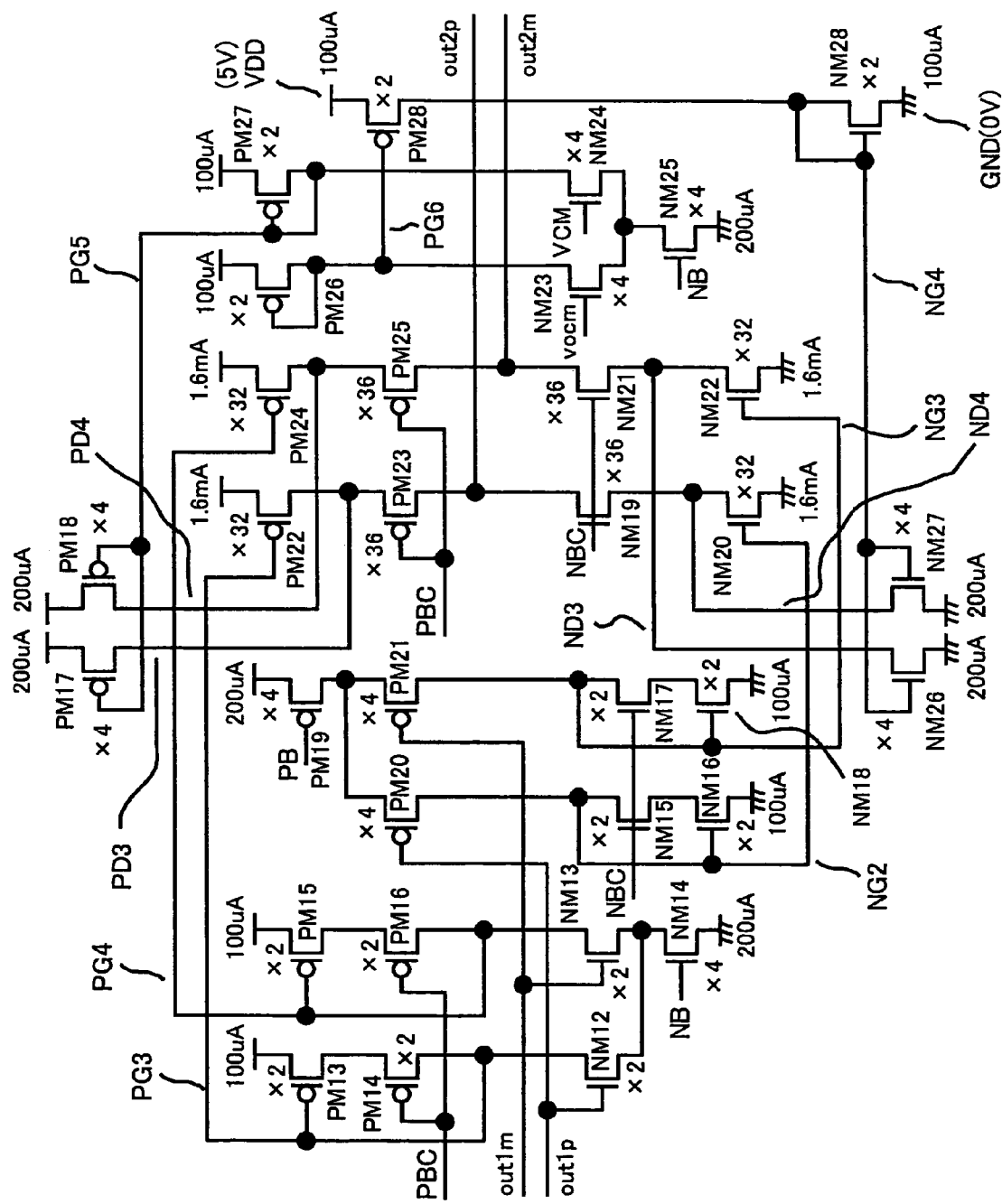
FIG. 13 is a circuit diagram of a second stage amplifier shown in FIG. 10 as illustrated at the transistor level.

The circuit shown in FIG. 13 includes PMOS transistors PM24 through PM28 and NMOS transistors NM12 through NM28. VDD is a positive power supply voltage (e.g., 5 V), and GND is 0 V. "inp" and "inn" indicate inputs to the amplifier, and "out1m" and "out1p" indicate outputs of the amplifier. NB and NBC are bias potentials applied to the NMOS transistors, and PB and PBC are bias potentials applied to the PMOS transistors. VCM is a common potential input for the purpose of a common mode feedback. ND3, ND4, PD3, PD4, PG3, PG4, PG5, NG2, NG3, and NG4 indicate internal nodes of the amplifier. "xd" (d: integer) shown alongside each MOS transistor demonstrates an example of the relative size of the corresponding MOS transistor. The value of an electric current shown alongside each circuit branch demonstrates an example of the amount of the corresponding electric current.

In FIG. 13, the circuit nodes and circuit elements corresponding to the circuit nodes and circuit elements shown in FIG. 10 are referred to by the same numerals. The circuit portion comprised of PM13, PM14, PM15, PM16, NM12, NM13, NM14, PM19, PM20, PM21, NM15, NM16, NM17, NM18, PM22, PM23, PM24, PM25, NM19, NM21, NM20, and NM22 in FIG. 13 serves as a differential amplifier circuit that amplifies the input signals out1m and out1p for provision to the outputs out2m and out2p. A push-pull configuration is used to increase the supply of load currents to the outputs. In response to the push-pull configuration used for the outputs, further, an input differential pair is provided for each of the NMOS portion and the PMOS portion. With these two points being duly noted, it should be relatively easy to understand the operation of the circuit, and a detailed explanation of the operation of this circuit portion will be omitted. In the following, a description will be given of the operation of the remaining circuit portion that functions as a common mode feedback circuit.

The gate of NM23 receives the common potential vocm of the output potentials, and the gate of NM24 receives VCM. These NM23 and NM24 together constitute a differential circuit. If the potential vocm is equal to the potential VCM, PM26 and PM27 allow the same amount of currents to flow. In the example shown in FIG. 13, an electric current of 100 µA runs through each of PM26 and PM27. Since an electric current of 100 µA runs through PM27, each of PM17 and PM18 allows an electric current of 200 µA to run therethrough. Since an electric current of 100 µA runs through PM26, each of NM26 and NM27 allows an electric current of 200 µA to run therethrough.

An electric current of 200 µA is supplied from each of PM17 and PM18, and an electric current of 200 µA flows through each of NM26 and NM27. In this case, therefore, PM17, PM18, NM26, and NM27 do not affect the potentials out2m and out2p. If the potential vocm is lower than the potential VCM, a large electric current flows through NM24. This results in the electric currents of PM17 and PM18 being larger than the electric currents of NM26 and NM27. Accordingly, the potentials out2m and out2p will rise. If the potential vocm is higher than the potential VCM, the electric current flowing through NM24 decreases. As a result, the electric currents of NM26 and NM27 become larger than the electric currents of PM17 and PM18.

In this manner, the feedback function of the common mode potential makes the circuit operate in such a manner that the common mode potential of the output potentials out2m and out2p coincides with VCM. As described above by use of an example, the circuit configuration as shown in FIG. 13 provides a specific implementation of AMP6 shown in FIG. 10.

Figure 14:
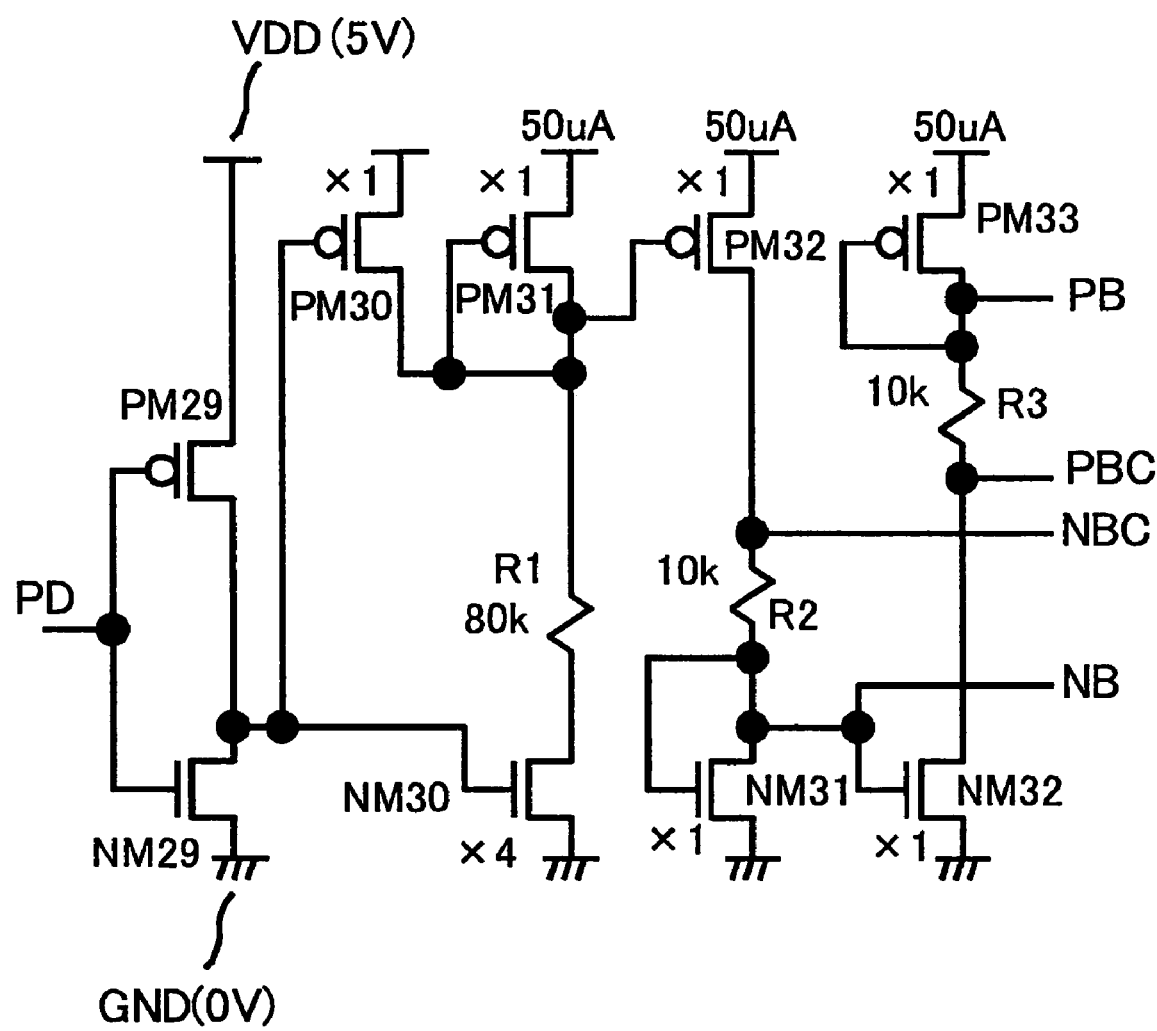
FIG. 14 is a drawing showing an example of the circuit that supplies bias potentials to the circuits of FIG. 12 and FIG. 13.

FIG. 14 is a drawing showing an example of the circuit that supplies bias potentials to the circuits of FIG. 12 and FIG. 13. The circuit shown in FIG. 14 includes PMOS transistors PM29 through PM33, NMOS transistors NM29 through NM32, and resistors R1 through R3. VDD is a positive power supply voltage, and GND is 0 V. NB and NBC are bias potentials applied to the NMOS transistors, and PB and PBC are bias potentials applied to the PMOS transistors. PD is a control signal input for the purpose of power-down control. "xd" (d: integer) shown alongside each MOS transistor demonstrates an example of the relative size of the corresponding MOS transistor. The value of an electric current shown alongside each circuit branch demonstrates an example of the amount of the corresponding electric current. The value of resistance shown alongside each resistor demonstrates an example of the resistance of the corresponding resistor.

The circuit shown in FIG. 14 serves as a bias circuit that supplies bias potentials PB, PBC, NB, and NBC in the circuits of FIG. 12 and FIG. 13.

An electric current that is equal in amount to the electric current running through the resistor R1 flows through PM32 by way of the current mirror circuit, thereby producing NB. NB is level-shifted by use of the resistor R2 (500 mV=10 k×50 µA in the example of FIG. 14), thereby producing NBC, which is a bias potential for the cascode purpose. The bias potentials PB and PBC are also produced in the same manner. By use of the bias circuit such as the example shown in FIG. 14, it is possible to provide bias potentials to the amplifier circuits shown in FIG. 12 and FIG. 13.

Figure 15:
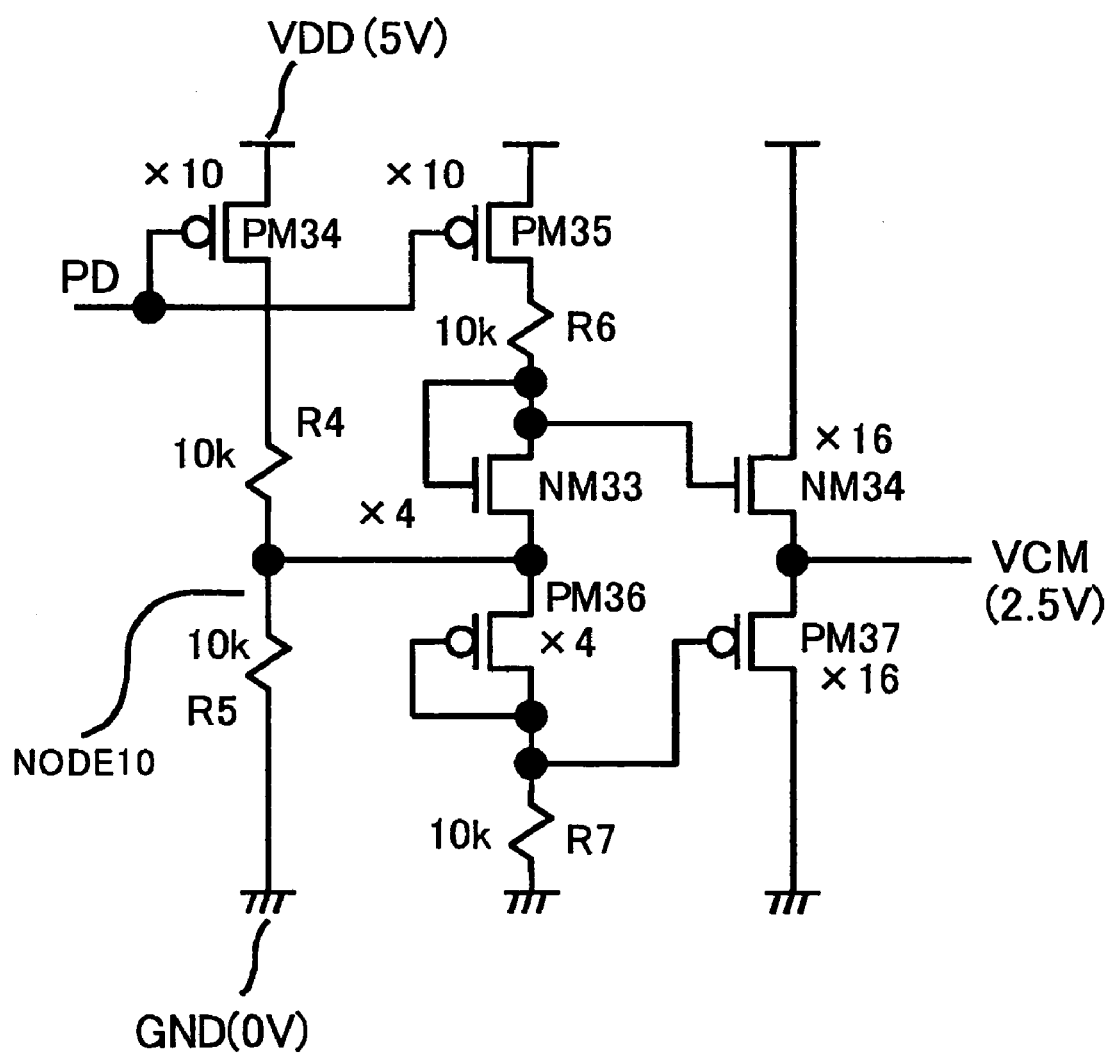
FIG. 15 is a drawing showing an example of the bias circuit that supplies a bias potential VCM to the circuits of FIGS. 5A and 5B, FIG. 10, FIG. 12 and FIG. 13.

FIG. 15 is a drawing showing an example of the bias circuit that supplies the bias potential VCM to the circuits of FIGS. 5A and 5B, FIG. 10, FIG. 12 and FIG. 13. As previously described, VCM is a bias potential that is set approximately to ½ of the power supply voltage Vdd. In principle, the power supply voltage can be divided by use of resistors to produce a desired potential in a straightforward manner. As can be understood from the circuit configuration shown in FIG. 5, however, there is a need to charge, to the potential VCM, all the top plates during the sampling operation of the switched capacitor DAC, the bottom plates of C27 and C28 during the sampling operation of the sample-hold amplifier circuit, etc. In order to create a design in which these nodes have sufficiently small time constants, the resistances of the resistors that divides the power supply potential by half need to be set sufficiently small. This gives rise to a problem in that power consumption increases. It is thus preferable to use the bias circuit as shown in FIG. 15 in order to decrease the equivalent resistance of VCM while keeping low power consumption.

The circuit of FIG. 15 includes PMOS transistors PM34 through PM37, NMOS transistors NM33 and NM34, and resistors R4 through R7. VDD is a positive power supply voltage, and GND is 0 V. VCM is a bias potential that is approximately equal to ½ of the power supply voltage Vdd. PD is a control signal input for the purpose of power-down control. NODE 10 indicates an internal node. "xd" (d: integer) shown alongside each MOS transistor demonstrates an example of the relative size of the corresponding MOS transistor. The value of resistance shown alongside each resistor demonstrates an example of the resistance of the corresponding resistor.

The potential at NODE10 is set approximately equal to ½ of the power supply voltage by way of the resistors R4 and R5. It is taken for granted that the effective resistances of PM34 and PM35 are sufficiently small. An electric current running through R6, NM33, PM36, and R7 is smaller than the electric current flowing through R4 and R5, so that R6, NM33, PM36, and R7 have little effect on NODE10. As a result, the potential at NODE10 is believed to be set approximately equal to ½ of the power supply voltage. VCM is obtained by outputting the potential of NODE10 through PMOS and NMOS source followers, so that the potential VCM is also set approximately equal to ½ of the power supply voltage. The use of the output of the push-pull-type source follower makes it possible to design a circuit in which the steady state current is small and the time constant at the time of charging is also small.

Figure 16:
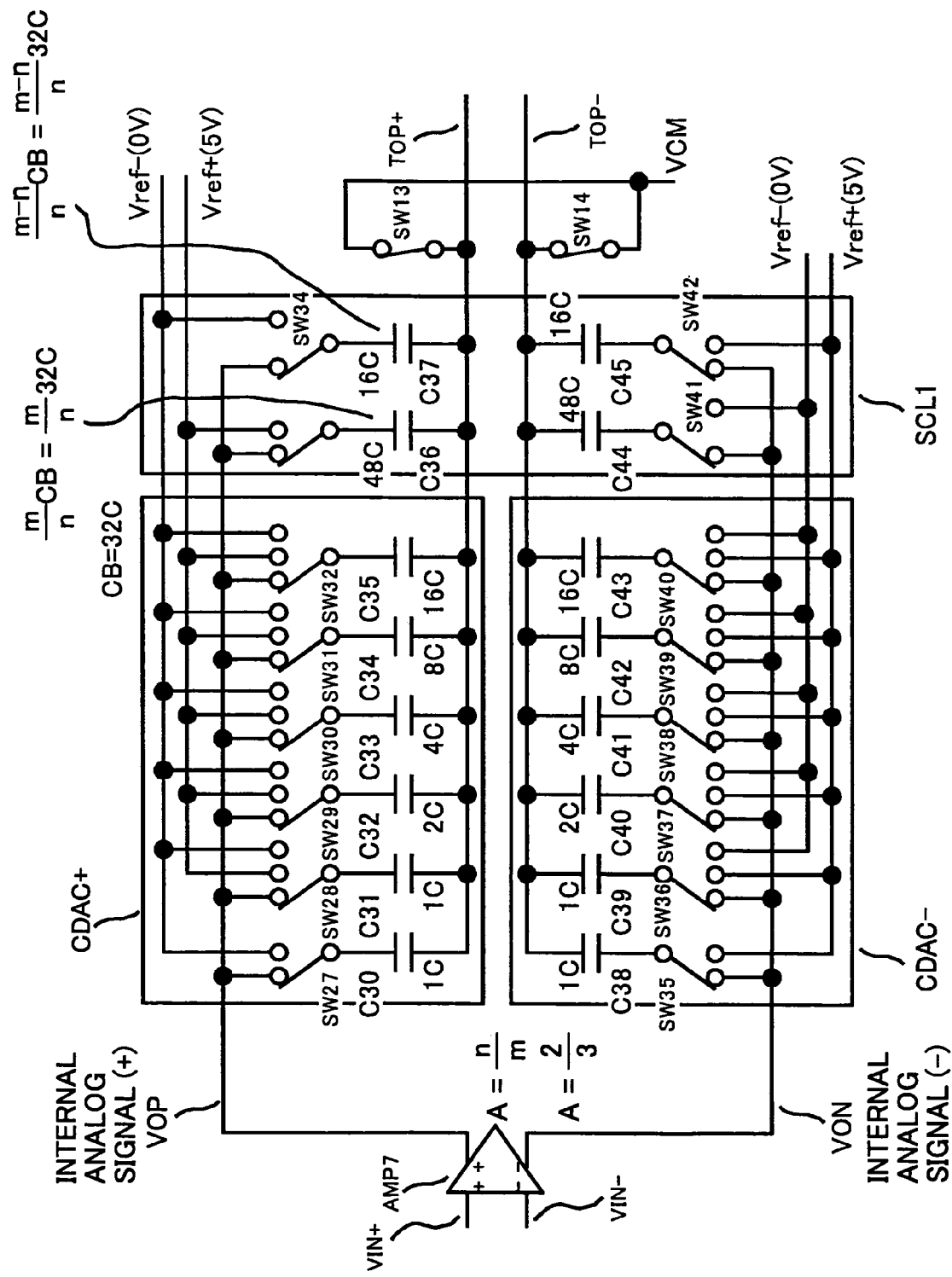
FIG. 16 is a drawing showing a generalized circuit configuration of the successive approximation A/D converter shown in FIG. 5.

FIG. 16 is a drawing showing a generalized circuit configuration of the successive approximation A/D converter shown in FIG. 5. In FIG. 16, the same elements as those of FIG. 5 are referred to by the same numerals.

The circuit of FIG. 16 includes switches SW13, SW14, and SW27 through SW42, capacitors C30 through C45, and a sample-hold amplifier circuit AMP7. VIN+ indicates a plus-side analog input, and VIN− indicates a minus-side analog input. VOP and VON are a plus-side output and a minus-side output (internal analog signal (+), internal analog signal (−)), respectively, of the sample-hold amplifier circuit. TOP+ designates a plus-side top plate of a capacitor array, and TOP− designates a minus-side top plate of the capacitor array. Vref+ is a plus-side reference potential (5V), and Vref− is a minus-side reference potential (0V). VCM is a bias potential (2.5 V) applied to the top plate at the time of sampling. CDAC+ is a plus-side switched capacitor DAC, and CDAC− is a minus-side switched capacitor DAC. SCL1 is a scaling circuit that adjusts the digital output of the A/D converter such that the output of the sample-hold amplifier circuit responding to the inputting of the reference voltage (i.e., potential difference between Vref+ and Vref−) into the sample-hold amplifier circuit corresponds to the maximum value of the digital output of the A/D converter. A value kC (k: integer) shown alongside each capacitor Cn (n: integer) specifies the relative size of the corresponding capacitance.

The amplifier AMP7 shown in FIG. 16 is a generalized version of the sample-hold amplifier circuit (AMP2, C25 through C28, switches, and so on) shown in FIG. 5. From the point of view of precision, it is preferable to use a switched capacitor sample-hold amplifier circuit, for which the voltage gain can be controlled by the relative ratio of the capacitances. However, an amplifier circuit that determines the voltage amplification factor by the ratio of resistances in a DC-based manner can as well be used as AMP7, and there would be no problem associated with its operation. The important point here is to set the voltage amplification factor to a value smaller than 1. With the voltage amplification factor being set to n/m (n<m), and the common potential of VOP and VON being controlled to be equal to VCM, the circuit of FIG. 16 can produce the same results as the circuit of FIGS. 5A and 5B, without regard to a specific circuit configuration of AMP7.

Namely, with the voltage gain of the amplifier AMP7 being set smaller than 1, the saturation of the output of the amplifier AMP7 can be avoided even when the potential difference between the analog input signals is equal to the power supply voltage. It is thus possible to cope with analog input signals having a potential difference equal to the power supply voltage, i.e, analog input signals varying over the rail-to-rail range. Further, capacitors (C36, C37, C44, C45) (SCL1) are provided that adjust (perform the scaling of) the digital output of the A/D converter such that the output of the sample-hold amplifier circuit responding to the inputting of the reference voltage (i.e., potential difference between Vref+ and Vref−) into the sample-hold amplifier circuit corresponds to the maximum value of the digital output of the A/D converter. With this provision, a proper digital output value (i.e., the same digital output value that is obtained directly sampling the analog signals by use of the switched capacitor DAC) is obtained despite the use of the amplifier AMP7 having the voltage gain thereof being smaller than 1 (n/m, m<m).

Moreover, the analog signals are transmitted to the switched capacitor DAC via the amplifier AMP7, which makes it possible to design the input capacitance of the amplifier AMP7 independently of the switched capacitor DAC. Reduction in the input capacitance makes it possible to increase the speed of the successive approximation A/D converter.

In FIG. 16, "A=n/m" shown alongside the amplifier AMP7 represents the voltage gain of the amplifier AMP7, and is ⅔ when the same design as in FIG. 5 is employed. Under this condition (A=⅔), if a total capacitance of the plus-side (or minus-side) switched capacitor DAC is 32C, the capacitors C36 and C44 are 48C, and the capacitors C37 and C45 are 16C. This was already described in connection with FIGS. 5A and 5B, FIG. 6, FIG. 7, FIG. 8, and FIG. 9. In the following, a description will be given of a generalized method that is used to determine the scaling-purpose capacitances.

It is taken for granted that in the circuit of FIG. 16, the common potential of VOP and VON is controlled to be equal to VCM in the same manner as in the circuit of FIG. 5. The amplifier AMP7 transfers to VOP and VON a potential difference proportional to the difference ((VIN+)−(VIN−)) between the analog input signals, and this potential difference is sampled by the switched capacitor DAC. In the same manner as in FIG. 5, the positions of the switches illustrated in FIG. 16 show their positions during the sampling operation in which VOP and VON are sampled by use of the switched capacitor DAC (plus-side switched capacitor DAC and minus-side switched capacitor DAC).

Turning to FIG. 6 again, a description will be given of the relationship between the voltage gain and the potentials VOP and VON. The voltage gain of the amplifier AMP7 is n/m. For the sake of simplicity of explanation, a specific example is used in which the power supply voltage Vdd is set to 5 V, the reference voltage Vref+ to 5 V, Vref− to 0 V, VCM to 2.5 V, VIN+ to 5 V, and VIN− to 0 V.

The potential VOP is ½+n/2 m=(m+n)/2 m (×Vdd) if the voltage gain of the amplifier AMP7 is set to n/m. In this example, thus, the potential VOP in FIG. 7 is replaced with (m+n)/2 m. In the case of the full-scale operation (i.e., when the input potential difference is equal to the power supply voltage), the potential of the top plate of the switched capacitor DAC is Vdd/2, and the potential of the bottom plate is Vdd(m+n)/2 m.

The electric charge stored in the top plate is represented as:

$$-CsVdd((m+n)/2\ m - \tfrac{1}{2}) = (-CsVdd)(n/2\ m) \tag{15}$$

Assuming that this electric charge is preserved, X in FIG. 7 can be obtained. A ratio of capacitance connections at the end of conversion is thus obtained in the case of the full-scale inputs.

$$(-X+Cs-X)Vdd/2 = (-CsVdd)(n/2\ m) \tag{16}$$

The above equation is solved to obtain the following.

$$X = Cs(m+n)/2\ m \tag{17}$$

When the potential difference ((VIN+)−(VIN−)) between the analog input signals is zero, VOP is equal to VCM, and Y=½(Cs/2) (see FIG. 8).

Since B in FIG. 9 is equal to Cs−X in FIG. 7 (the portion corresponding to D in FIG. 9 is all coupled to Vdd if all the bits of the digital code are 1), the following is derived.

$$B = Cs - x \quad (18)$$
$$= Cs - Cs(m+n)/2m$$
$$= Cs(m-n)/2m$$

Further, Y ($=\frac{1}{2}$) in FIG. 8 is equal to B+D. This is because the portion corresponding to D in FIG. 9 is all coupled to 0 V if all the bits of the digital code are 0. Accordingly, the following equation is obtained.

$$Cs/2 = Cs(m-n)/2\,m + D \quad (19)$$

Therefore, the following is obtained.

$$D = (Cs)(n/2\,m) \quad (20)$$

Attention is turned to FIG. 16 again. Equation (20) provides the relationship between the total capacitance Cs and the capacitance D of the capacitors whose bottom plates are selectively coupled in response to the digital code of the switched capacitor DAC. By representing the portion D as CB, the total capacitance is represented as follows.

$$Cs = (CB)(2\,m/n) \quad (21)$$

By substituting equation (21) into equation (18), B (which is the capacitance of the capacitors C37 and C45 shown in FIG. 16) is obtained as a general solution.

$$B = Cs(m-n)/2m \quad (22)$$
$$= (CB)(2m/n)(m-n)/2m$$
$$= (CB)(m-n)/n$$

The result obtained as expression (22) is also shown in FIG. 16. If CB=32C, m=3, and n=2, then, B is equal to 16C, which is the same as the capacitance of the capacitors C37 and C45 described in connection with FIGS. 5A and 5B.

Further, Y($=\frac{1}{2}$) in FIG. 8 is equal to A in FIG. 9. This is because the portion corresponding to D in FIG. 9 is all coupled to 0 V if all the bits of the digital code are 0. Accordingly, the following equation is obtained.

$$A = Cs/2 = (CB)(m/n) \quad (23)$$

This corresponds to the capacitance of the capacitors C36 and C44 shown in FIG. 16. This result is also shown in FIG. 16. If CB=32C, m=3, and n=2, then, A is equal to 48C, which is the same as the capacitance of the capacitors C36 and C44 described in connection with FIGS. 5A and 5B.

Based on the procedure as described above, the capacitance of the capacitors C36, C37, C44, and C45 of the scaling circuit SCL1 can be determined from the total capacitance of the plus-side switched capacitor DAC and the minus-side switched capacitor DAC when the voltage gain of the amplifier AMP7 is n/m. The sampling operation and digital-value search operation of the circuit shown in FIG. 16 are the same as those of the circuit of FIG. 5, and a description thereof will be omitted.

Figure 17A:
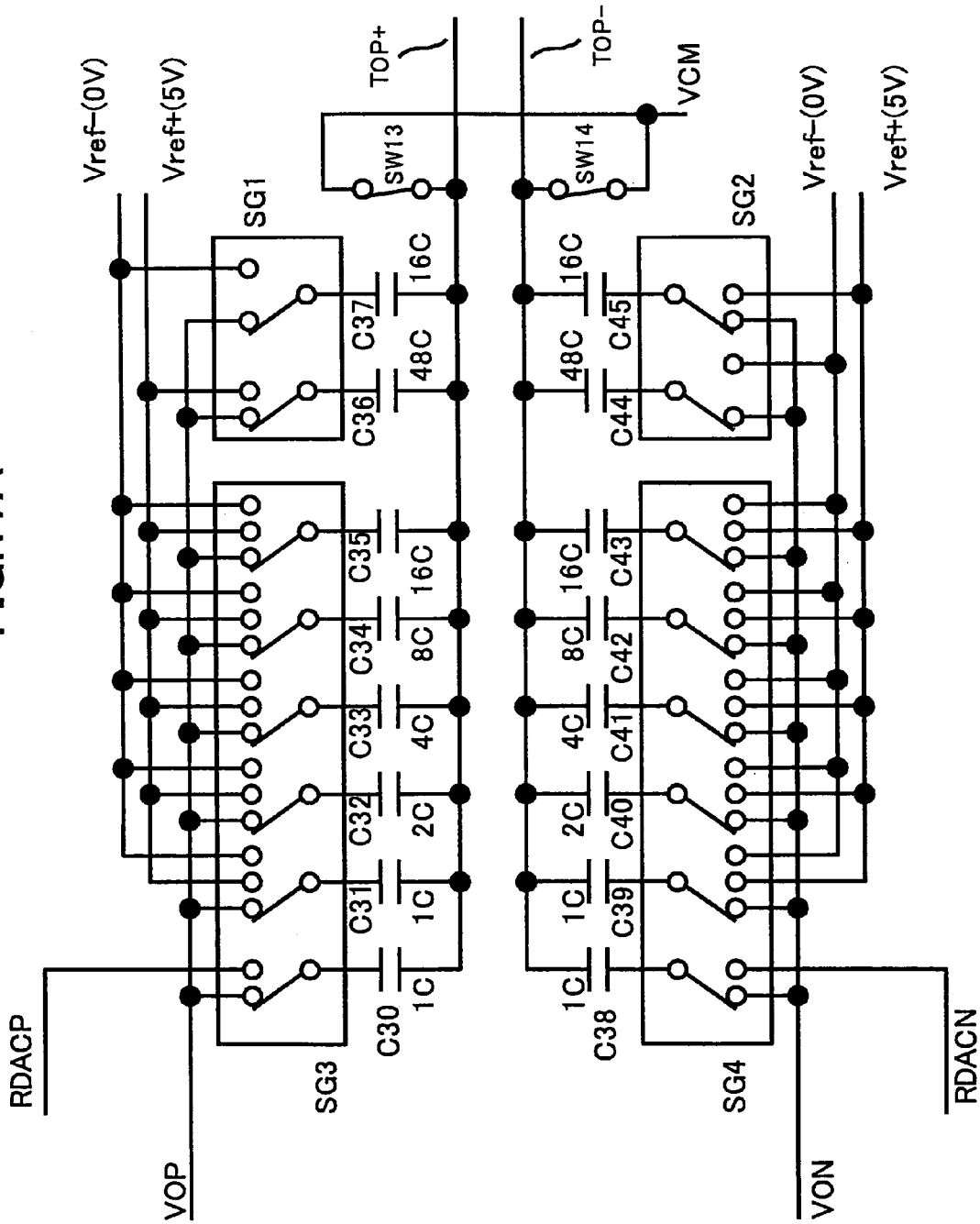
FIGS. 17A and 17B are circuit diagrams showing the configuration of another embodiment of the successive approximation A/D converter according to the present invention.
Figure 17B:
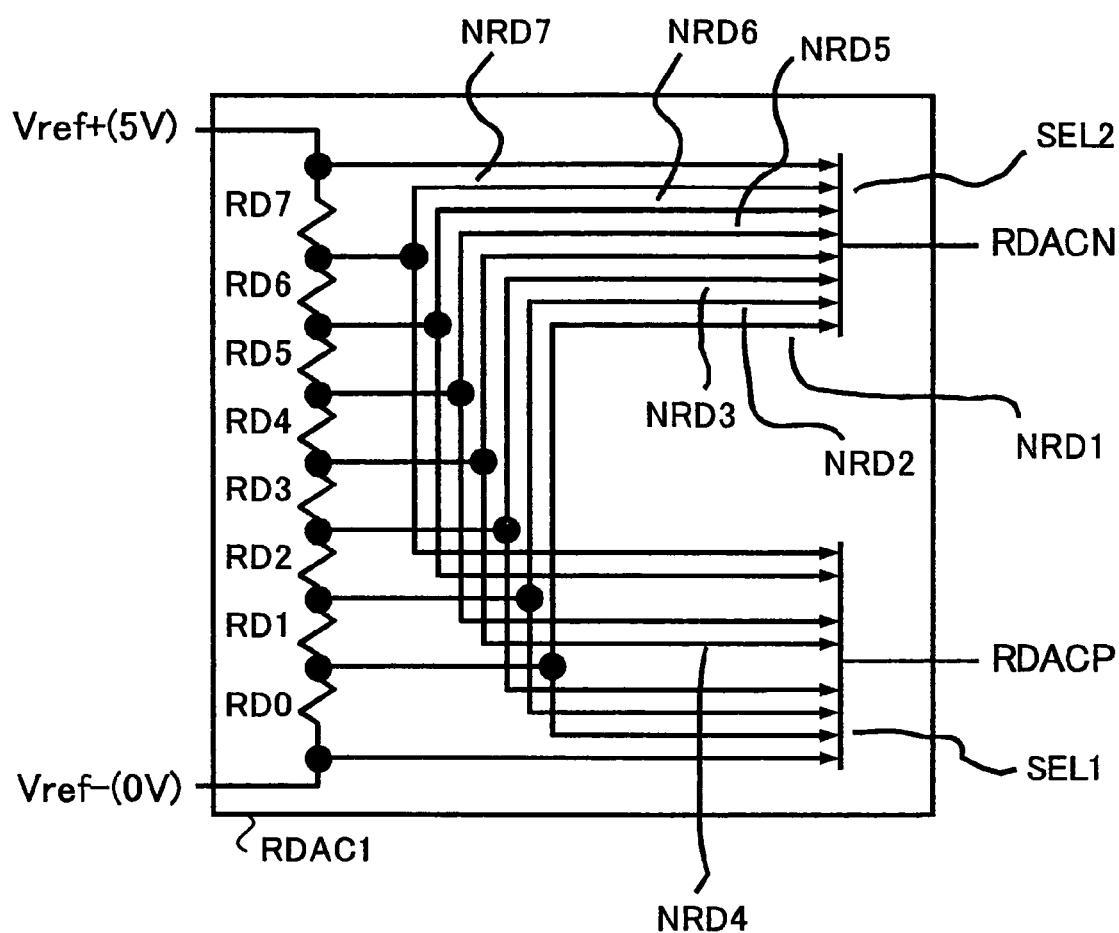

FIGS. 17A and 17B are circuit diagrams showing the configuration of another embodiment of the successive approximation A/D converter according to the present invention. This circuit includes switches SW13, SW14, SG3, SG4, SG1, and SG2 and capacitors C30 through C45 shown in FIG. 17A, and further includes a register DAC (RDAC1) shown in FIG. 17B. VOP and VON are a plus-side output and a minus-side output (internal analog signal (+), internal analog signal (−)), respectively, of the sample-hold amplifier circuit. TOP+ designates a plus-side top plate of a capacitor array, and TOP− designates a minus-side top plate of the capacitor array. Vref+ is a plus-side reference potential (5V), and Vref− is a minus-side reference potential (0V). VCM is a bias potential (2.5 V) applied to the top plate at the time of sampling. The resistor DAC (RDAC1) includes resistors RD0 through RD7 and selectors SEL1 and SEL2, and generates RDACP and RDACN. NRD1 through NRD7 are internal nodes of the resistor DAC. A value kC (k: integer) shown alongside each capacitor Cn (n: integer) specifies the relative size of the corresponding capacitance.

The positions of the switches illustrated in FIG. 17A show their positions at the time of sampling VOP and VON. In FIG. 17, the circuit portions performing the same functions as those of FIG. 5 and FIG. 16 are referred to by the same numerals. The circuit of FIG. 17 differs from the circuits of FIG. 5 and FIG. 16 in that upper-order bits are determined by the switched capacitor DAC, and lower-order bits are determined by the resistor DAC in the circuit of FIG. 17 whereas only the switched capacitor DAC constitutes the A/D converter circuit in the circuits of FIG. 5 and FIG. 16. As shown in FIG. 17, the present invention is applicable to a hybrid DAC comprised of capacitors and resistors.

In the circuits shown in FIG. 5 and FIG. 16, when a digital code corresponding to the analog inputs is searched for, the bottom plate of the capacitor C30 is fixedly coupled to Vref− and the bottom plate of the capacitor C38 is fixedly coupled to Vref+. With these bottom plates being coupled as described above, the bottom plates of the capacitors C31 through C35 are coupled to Vref+ if the corresponding bits of the digital code are 1, and are coupled to Vref− if the corresponding bits of the digital code are 0. In the minus-side switched capacitor DAC, symmetrical to the plus-side switched capacitor DAC, the bottom plates are coupled to Vref− if the corresponding bits of the digital code are 1, and are coupled to Vref+ if the corresponding bits of the digital code are 0.

If 10-bit resolution is necessary, for example, 1024 unit capacitors are necessary on one side. This gives rise to a problem in that the occupied size is large. This problem of the occupied area size can be solved by implementing the DAC as a double-stage DAC.

A CR double-stage DAC is implemented by coupling the output RDACP of the resistor DAC to the bottom plate of the capacitor C30. Further, a CR double-stage DAC is also implemented with respect to the minus-side switched capacitor DAC by coupling the output RDACN of the resistor DAC to the bottom plate of the capacitor C38.

RDAC1 is an example of the resistor DAC that converts the three lower-order bits. The unit resistors RD0 through RD7 divide the reference voltage (the potential difference between Vref+ and Vref−) by eight. NRD1 through NRD7 are assigned to the eight resulting potentials in an ascending order. The selector SELL selects one of Vref− and the potentials corresponding to the internal nodes NRD1 through NRD7 of the resistor DAC in response to the input digital value, and supplies the selected output to RDACP. For example, Vref− is output if the input digital value is 000. As the digital value increases successively, one of NRD1 through NRD7 selected in an ascending order is output.

The selector SEL2 selects one of Vref+ and the potentials corresponding to the internal nodes NRD7 through NRD1 in response to the input digital value, and supplies the selected output to RDACN. Symmetrical to RDACP, Vref+ is output if the input digital value is 000. As the digital value increases successively, one of NRD7 through NRD1 selected in a descending order is output.

Even when the DAC is implemented as a double-stage DAC comprised of capacitors and resistors as shown in FIGS. 17A and 17B, the relationship between the maximum values of VOP and VON and the necessary conversion result remains the same as that of the circuits of FIG. 5 and FIG. 16. Accordingly, the principle of the configuration of the scaling circuit SCL1 described in connection with FIG. 16 is applicable without any change. For example, if the voltage gain of the circuit outputting VOP and VON is ⅔, the capacitance of the capacitors C36 and C44 is 48C, and the capacitance of the capacitors C37 and C45 is 16C As described above, the principle of the voltage gain and scaling circuit of the present invention is equally applicable to the configuration that employs a CR double-stage DAC. Accordingly, the advantage of a double-stage DAC that the occupied area size can be kept small can be achieved simultaneously with the advantage of the successive approximation A/D converter of the present invention that the input capacitance can be kept small.

Figure 18A:
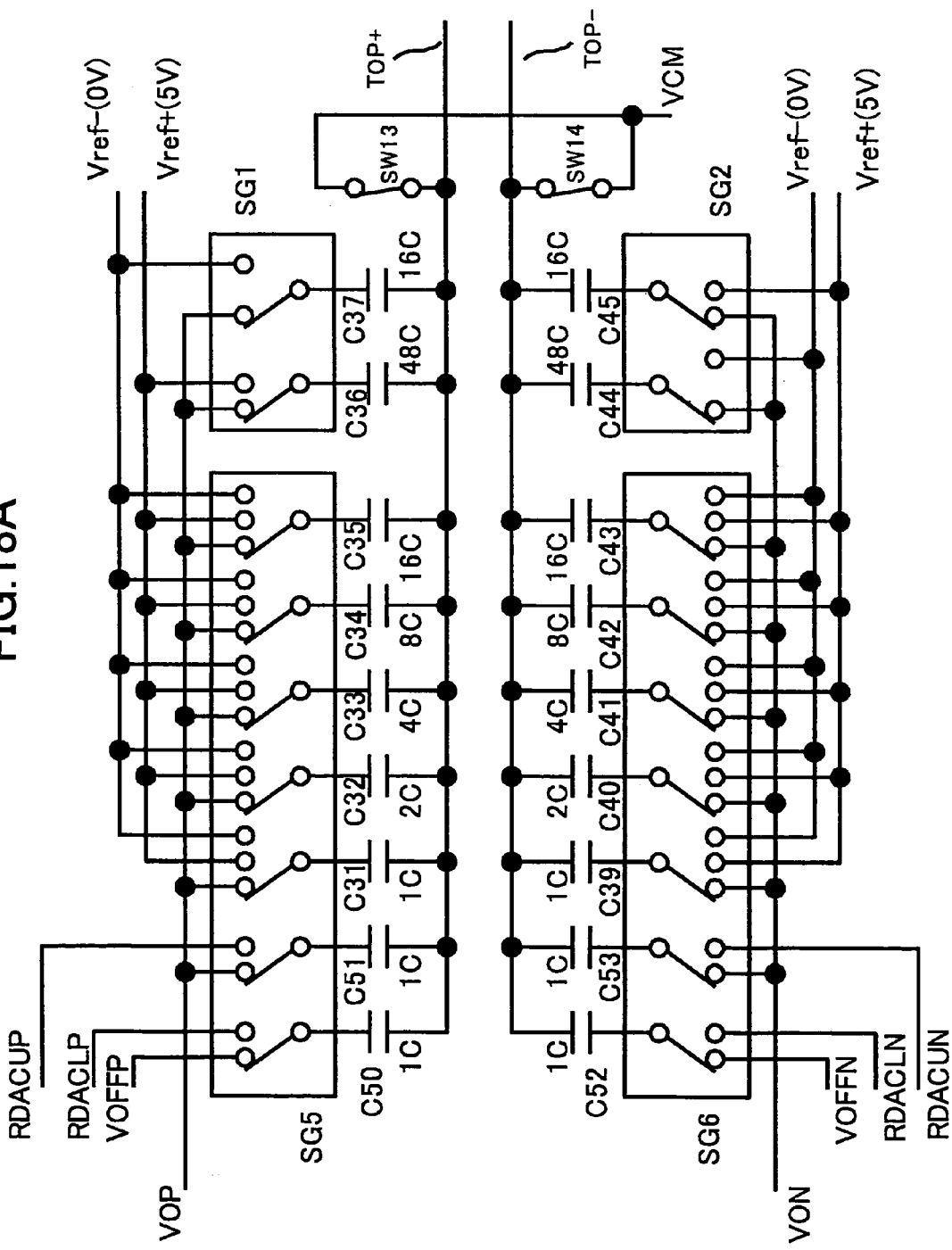
FIGS. 18A and 18B are circuit diagrams showing the configuration of another embodiment of the successive approximation A/D converter according to the present invention.
Figure 18B:
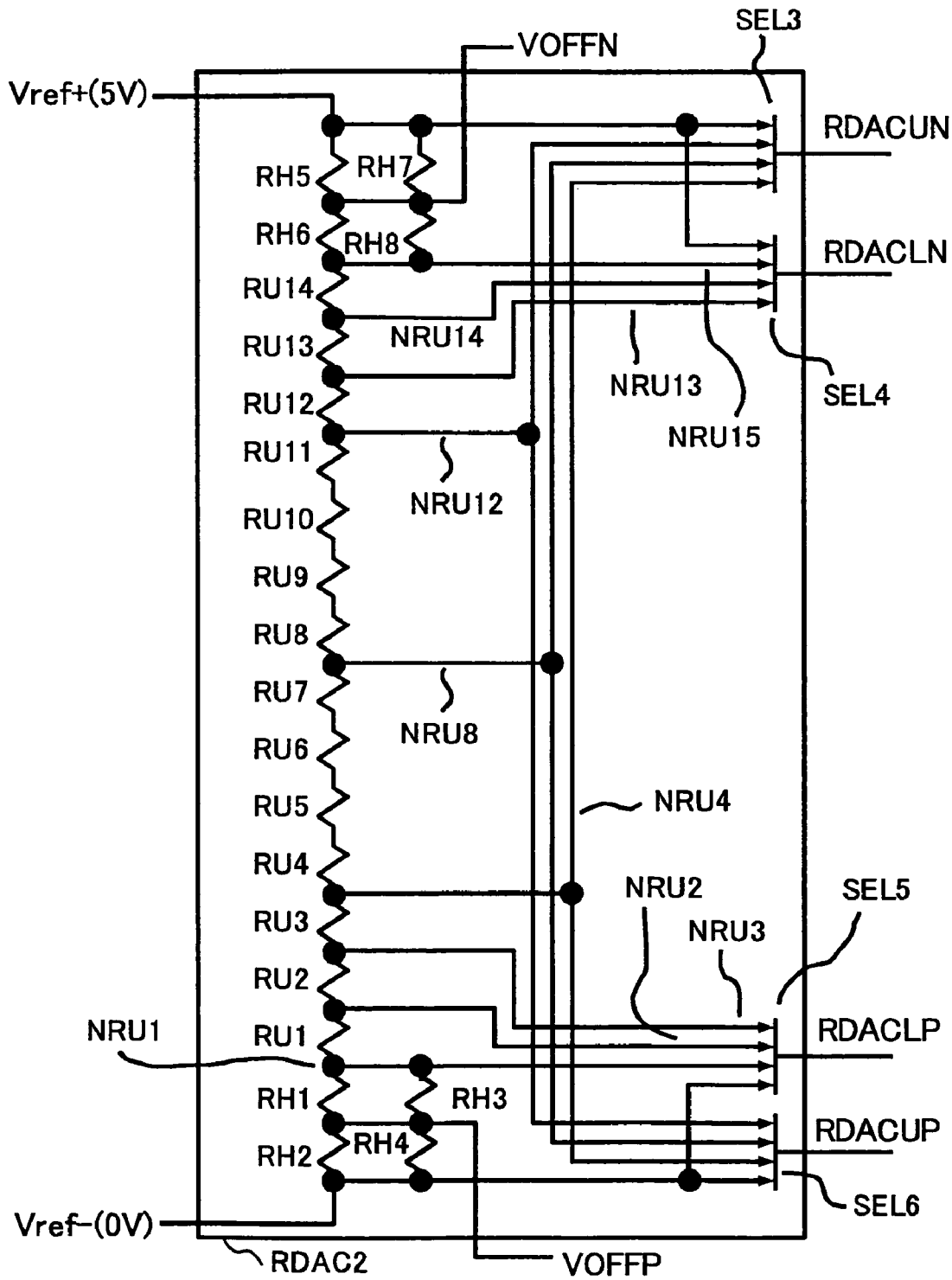

FIGS. 18A and 18B are circuit diagrams showing the configuration of another embodiment of the successive approximation A/D converter according to the present invention. This circuit includes switches SW13, SW14, SG5, SG6, SG1, and SG2 and capacitors C31 through C37, C39 through C45, and C50 through C53 shown in FIG. 18A, and further includes a register DAC (RDAC2) shown in FIG. 18B. VOP and VON are a plus-side output and a minus-side output (internal analog signal (+), internal analog signal (−)), respectively, of the sample-hold amplifier circuit. TOP+ designates a plus-side top plate of a capacitor array, and TOP− designates a minus-side top plate of the capacitor array. Vref+ is a plus-side reference potential (5V), and Vref− is a minus-side reference potential (0V). VCM is a bias potential (2.5 V) applied to the top plate at the time of sampling. The resistor DAC (RDAC2) includes resistors RU1 through RU14 and RH1 through RH8 and selectors SEL3, SEL4, SEL5, and SEL6. RDACUP, RDACUN, RDACLP, and RDACLN are the outputs of the resistor DAC. VOFFP and VOFFN are bias potentials for providing an offset to the converted result. Moreover, NRU1 through NRU4, NRU8 and NRU12 through NRU15 are internal nodes of the resistor DAC. A value kC (k: integer) shown alongside each capacitor Cn (n: integer) specifies the relative size of the corresponding capacitance.

The positions of the switches illustrated in FIG. 18A show their positions at the time of sampling VOP and VON. In FIGS. 18A and 18B, the circuit portions performing the same functions as those of FIG. 5, FIG. 16, and FIGS. 17A and 17B are referred to by the same numerals. In the circuit of FIGS. 17A and 17B, the outputs of the resistor DAC are supplied to the bottom plates of the capacitors C30 and C38. In the circuit of FIGS. 18A and 18B, the capacitors C50, C51, C52, and C53 are provided in place of the capacitors C30 and C38, and the outputs of the resistor DAC is supplied to the bottom plates of the capacitors C50, C51, C52, and C53. In this circuit configuration, the capacitors C50 and C51 or the capacitors C52 and C53 are used to add the outputs of the resistor DAC.

In the following, the configuration of the resistor DAC will be described. RDAC2 of FIG. 18B serves as a resistor DAC for converting the 4 lower-order bits. RU1 through RU14 and RH1 through RH8 each represent a unit resistor having the same resistance. RH1 through RH4 is configured such that two unit resistors connected in parallel are connected in series, so that a total of the four resistors is equivalent to a single unit resistor. By the same token, the four resistors RH5 through RH8 create a combined resistance that is equivalent to that of a single unit resistor. Accordingly, RU1 through RU14 and RH1 through RH8 divide the reference voltage (i.e., the potential difference between Vref+ and Vref−) by 16. NRUe (e: integer) is assigned to the internal nodes of the resistor DAC in an ascending order of potential. Here, "e" of NRUe corresponds to e/16 of the reference potential.

VOFFN is obtained by dividing the potential difference between NRU15 and Vref+ by half by use of the resistors RH5 through RH8, and is ((Vref+)−(Vref−))/32 lower than Vref+. VOFFP is obtained by dividing the potential difference between NRU1 and Vref− by half by use of the resistors RH1 through RH4, and is ((Vref+)−(Vref−))/32 higher than Vref−.

Upon receiving a 4-bit digital signal, RDAC2 supplies potentials corresponding to the two upper-order bits to RDACUN and RDACUP, and supplies potentials corresponding to the two lower-order bits to RDACLN and RDACLP. That is, RDAC2 functions as a 4-bit-input 4-output DAC circuit.

The selector SEL5 selects one of the potentials Vref−, NRU1, NRU2, and NRU3 for provision to RDACLP. If the two lower-order bits of the input into RDAC2 is 00, Vref−is selected. Higher potentials NRU1, NRU2, and NRU3 are selected in response to 01, 10, and 11, respectively.

RDACLN outputs a potential that is symmetrical to RDACLP. The selector SEL4 selects one of the potentials Vref+, NRU15, NRU14, and NRU13 for provision to RDACLN. If the two lower-order bits of the input into RDAC2 is 00, Vref+ is selected. Lower potentials NRU15, NRU14, and NRU13 are selected in response to 01, 10, and 11, respectively.

A description will now be given of the potential at RDACUP. The selector SEL6 selects one of the potentials Vref−, NRU4, NRU8, and NRU12 for provision to RDACUP. If the two higher-order bits of the input into RDAC2 is 00, Vref− is selected. Higher potentials NRU4, NRU8, and NRU12 are selected in response to 01, 10, and 11, respectively.

A description will now be given of the potential at RDACUN. RDACUN outputs a potential that is symmetrical to RDACUP. The selector SEL3 selects one of the potentials Vref+, NRU12, NRU8, and NRU4 for provision to RDACUN. If the two higher-order bits of the input into RDAC2 is 00, Vref+ is selected. Lower potentials NRU12, NRU8, and NRU4 are selected in response to 01, 10, and 11, respectively.

RDACUP, RDACUN, RDACLP, and RDACLN obtained as described above are supplied to the bottom plates of the capacitors C51, C53, C50, and C52, respectively, which are the smallest capacitors of the switched capacitor DAC, as shown in FIG. 18. In this manner, a CR double-stage DAC that adds the outputs of the resistor DAC via capacitors is implemented.

The capacitors C51 and C53 are equivalent to the capacitors C30 and C38 shown in FIG. 17A, and serve also as sampling capacitors. In parallel thereto, the capacitors C50 and C52 are provided. The capacitors C50 and C52 are not used to sample VOP and VON. Because of this, the operation of the switched capacitor DAC is equivalent to the operation of the circuit of FIG. 17A when considering the capacitors C51, C31 through C35, C53, and C39 through C43. Accordingly, the capacitors C36, C37, C44, and C45 for voltage scaling can be designed based on the same principle as in the case of the circuit of FIG. 17A.

In the circuit of FIG. 18A, the capacitors C50 and C52 are added to the circuit of FIG. 17A, and the potentials of RDACLP and RDACLN are added to the top plate potentials TOP+ and TOP−, respectively, via the capacitors C50 and C52. In FIG. 7 or FIG. 8, the presence of a parasitic capacitance between a top plate and a predetermined potential does not affect the results. That is, the operation and A/D conversion results of the switched capacitor DAC are substantially the same in FIG. 18A regardless of whether the capacitors C50 and C52 are provided or not. There is thus no problem when the capacitors C50 and C52 are additionally provided, with the outputs of the resistor DAC being applied to the bottom plates thereof to add the potentials of RDACLP and RDACLN to the top plate potentials TOP+ and TOP−, respectively (according to weighting factors determined based on the total capacitance and 1C).

In the following, a description will be given of the significance of VOFFP and VOFFN. In an A/D conversion circuit, it is sometimes desired to displace a transition point of a digital code (conversion result) 0.5LSB off from the point that is achieved by the circuit as shown in FIG. 5 or FIG. 16 in terms of the input/output characteristics of the analog input potentials and the digital conversion result. To this end, the capacitors C50 and C52 are provided in FIG. 18, with VOFFP and VOFFN supplied to the bottom plates thereof at the time of sampling. As previously described, the potential VOFFN is ((Vref+)−(Vref−))/32 lower than Vref+, and VOFFP is ((Vref+)−(Vref−))/32 higher than Vref−. Each voltage NRUe (e: integer) obtained by 16-fold division by RDAC2 corresponds to LSB of the A/D conversion circuit of FIGS. 18A and 18B. VOFFP and VOFFN supplied to the bottom plates of the capacitors C50 and C52 at the time of sampling are thus 0.5LSB off from the plus and minus reference voltages. With this provision, the sampling result is displaced by 0.5LSB (LSB/2) at the start of conversion.

FIGS. 18A and 19B are directed to an example in which the resolution of the switched capacitor DAC is 5 bits, and the resolution of the resistor DAC is 4 bits (2 bits+2 bits). It should be noted, however, that the present invention is applicable to configurations with any resolution not only with respect to the configuration shown FIGS. 18A and 18B but also with respect to the configurations shown in FIG. 5, FIG. 16, and FIGS. 17A and 17B.

Figure 19:
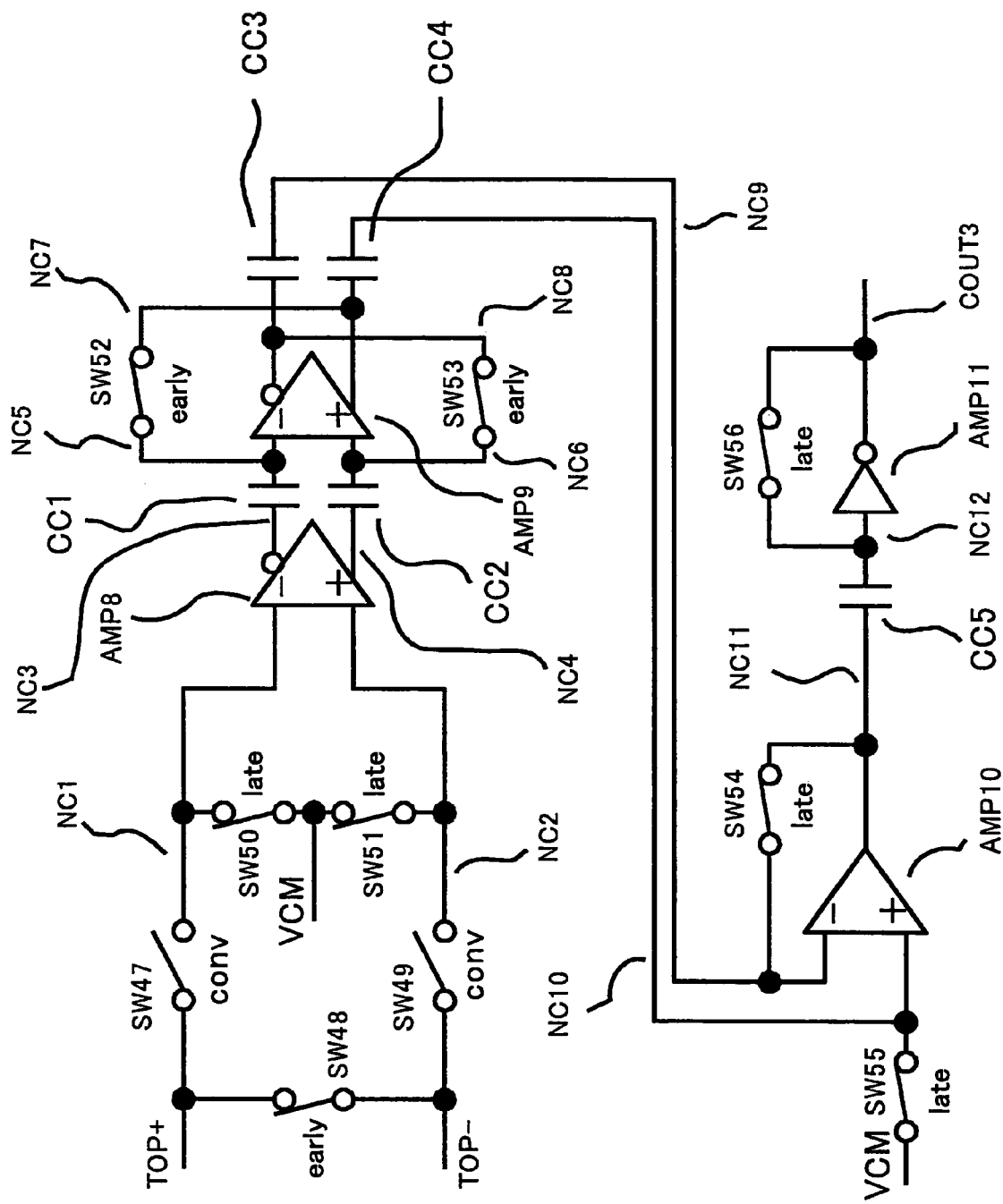
FIG. 19 is a drawing showing an example of the circuit configuration of a comparator that detects a potential difference between the outputs of a switched capacitor DAC.

In FIG. 5, FIG. 16, FIGS. 17A and 17B, and FIGS. 18A and 18B, examples of the circuit configuration up to the switched capacitor DAC have been described. FIG. 19 is a drawing showing an example of the circuit configuration of a comparator that detects a potential difference between TOP+ and TOP− that are outputs of the switched capacitor DAC.

The circuit of FIG. 19 includes switches SW47 through SW56, capacitors CC1 through CC5, and amplifiers AMP8 through AMP11. TOP+ designates a plus-side top plate of a capacitor array, and TOP− designates a minus-side top plate of the capacitor array. VCM is a bias potential (2.5 V) applied to the top plate at the time of sampling. "early", "late", "conv" are timing signals as shown in FIG. 20. NC1 through NC12 are internal nodes. COUT3 is a comparison result of the comparator. The positions of the switches illustrated in FIG. 19 show their positions at the time of sampling the potentials VOP and VON by the switched capacitor DAC.

In the following, the operation for sampling the potentials VOP and VON by the switched capacitor DAC will be described. The top plates TOP+ and TOP− of the switched capacitor DAC are controlled by the switch SW48 such as to be at the same potential. At the end of sampling performed by the switched capacitor DAC, the potentials at TOP+ and TOP− are VCM. It is thus desirable to perform an auto-zero operation by memorizing the offset voltage of the comparator under this condition.

Provision may be made such that TOP+ and OTP1 are directly input into the comparator. Such direct inputting, however, requires a certain time period for sampling VOP and VON by the switched capacitor DAC as defined by a sum of the time constant for charging TOP+ and TOP− and the time for performing an auto-zero of the comparator.

In order to shorten this time period, the circuit of FIG. 19 is configured such that VCM is input into the comparator separately during the sampling operation of sampling VOP and VON, and TOP+ and TOP− are coupled to the inputs of the comparator only at the start of conversion. With this provision, the potentials VOP and VON are sampled by the switched capacitor DAC by waiting until the potentials at TOP+ and TOP− are sufficiently stabilized, and, concurrently therewith, the memorizing of the offset voltage for performing an auto-zero of the comparator is completed.

The switches SW47, SW49, SW50, and SW51 shown in FIG. 19 are provided for this purpose. The switches SW47 and SW49 serve to disconnect the inputs of the comparator from TOP+ and TOP−, and VCM is supplied separately.

If AMP8 has an offset, applying the same VCM potential to NC1 and NC2 does not result in the outputs NC3 and NC4 being the same potential. These potentials are stored in CC1 and CC2, thereby canceling the offset voltage. While VOP and VON are being sampled by the switched capacitor DAC, SW52, SW53, SW54, and SW56 are closed. The closing of SW52 and SW53 provides for the potential difference between NC5 and NC6 to be substantially the same as the offset voltage of AMP9. Similarly, offset voltages are stored in coupling capacitors with respect to AMP10 and AMP11.

After sampling VOP and VON in the switched capacitor DAC, the switches SW48, SW52, and SW53 with "early" shown alongside are opened. Thereafter, the switches SW50, SW51, SW54, SW55, and SW56 with "late" shown alongside are opened, followed by closing of the switches SW47 and SW49 with "conv" shown alongside.

By use of the circuit as shown in FIG. 19, it is possible to detect the potential difference between TOP+ and TOP− that are the outputs of the switched capacitor DAC to determine which is larger. Namely, the circuit as shown in FIG. 19 can be used as a comparator for use in the successive approximation A/D converter according to the present invention.

Figure 22:
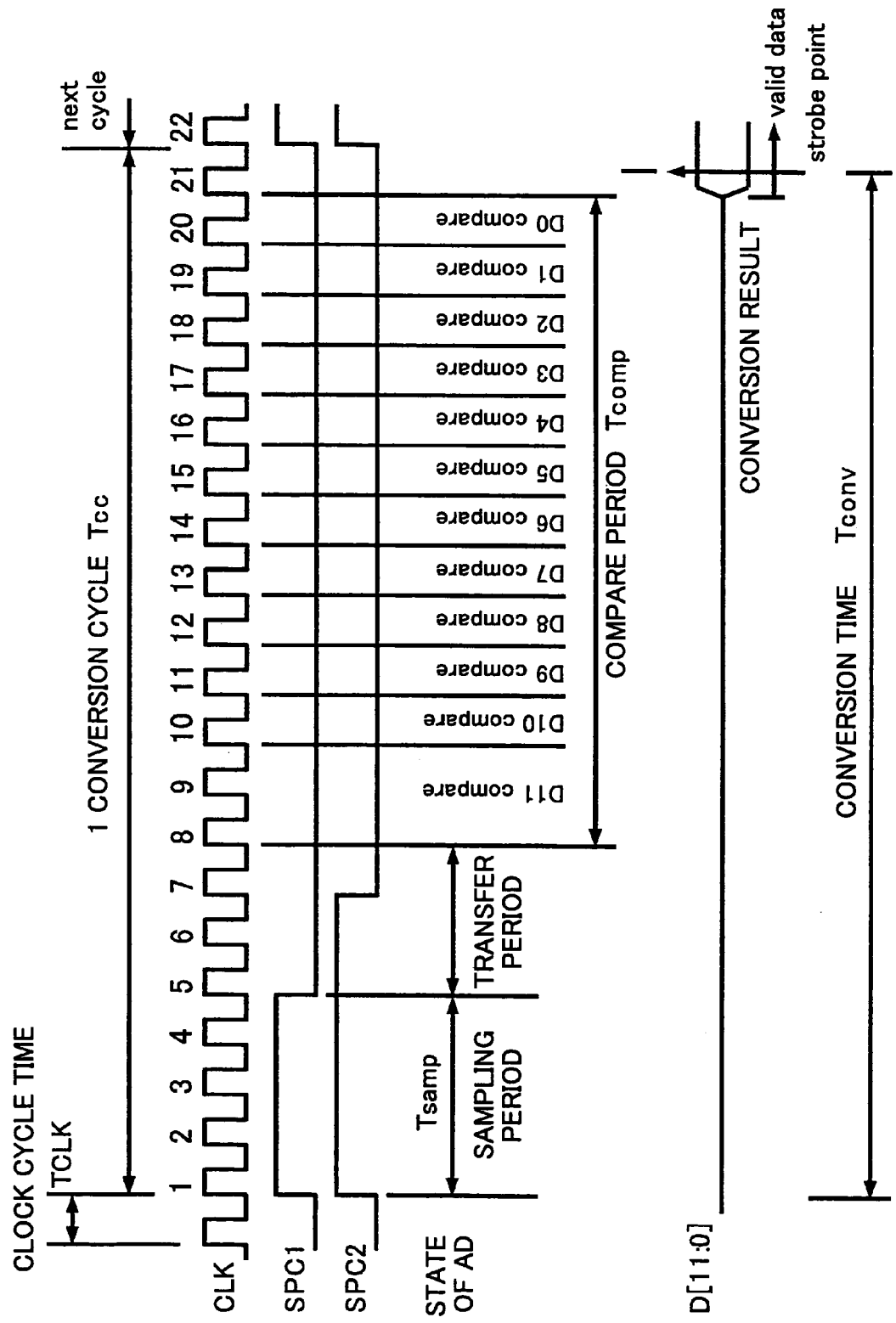
FIG. 22 is a timing chart showing an example of operation timings of the circuit of FIG. 21.

FIG. 21 is a block diagram showing an example of the configuration of the successive approximation A/D converter according to the present invention. FIG. 22 is a timing chart showing an example of operation timings of the circuit of FIG. 21.

The successive approximation A/D converter shown in FIG. 21 includes a sample-hold amplifier circuit SHA1 having a voltage gain of A=n/m, a switched capacitor D/A converter (CDAC) CDAC1, a comparator COMP, a resistor D/A converter (RDAC) RDAC3, and a control circuit CNT that controls successive approximations (successive comparisons). Although this example includes a resistor D/A converter, a configuration without a resistor D/A converter is equally possible.

VIN+ is a plus-side analog input, and VIN− is a minus-side analog input. VOP and VON are a plus-side output and a minus-side output (internal analog signal (+), internal analog signal (−)), respectively, of the sample-hold amplifier circuit. TOP+ designates a plus-side top plate of a capacitor array, and TOP− designates a minus-side top plate of the capacitor array.

COUT is the output of the comparator circuit, and RDO is the output of the resistor DAC. The control circuit CNT operates in response to the output COUT of the comparator circuit to control the resistor DAC via a control signal CNTR and to control the switched capacitor DAC via a control signal CNTC. To be specific, the opening/closing of the switches connected to the capacitors of the capacitor array of the switched capacitor D/A converter CDAC1 are controlled according to the control signal CNTC.

CLK is a clock input that defines the timing of the A/D conversion circuit. SPC1 is a signal that defines the sampling period of the sample-hold amplifier circuit. SPC2 is a signal that defines the period during which the switched capacitor DAC samples VOP and VON (i.e., the period during which VOP and VON are transferred to the switched capacitor DAC). D[11:0] serving as a non-limiting example represents a 12-bit A/D conversion result.

In the following, the operation of the circuit of FIG. 21 will be described with reference to FIG. 22. The clock signal CLK is supplied as shown in FIG. 22. During the period in which the control signal SPC1 is H, the sample-hold amplifier circuit SHA1 samples VIN+ and VIN−. When SPC1 is changed to L, the sampled potential difference appears at the outputs VOP and VON of the sample-hold amplifier circuit, and is then sampled by the switched capacitor DAC (CDAC1). That is, the outputs VOP and VON of the sample-hold amplifier circuit are transferred to CDAC1. The period for this transfer operation is shown as a transfer period in FIG. 22.

One clock cycle after the control signal SPC2 is changed from H to L, the transfer period (the period during which VOP and VON are sampled by CDAC1) comes to an end. After this, the input signals into the switched capacitor DAC (CDAC1) and the resistor DAC (RDAC3) are controlled to determine the conversion result sequentially from MSB to LSB. The time period for this operation is illustrated as a compare period in FIG. 22. After LSB is determined, the conversion result D[11:0] becomes valid.

In an example of the operation shown in FIG. 22, two clock cycles are spent only on the comparison of MSB (D11) in order to secure a sufficient time for comparing each bit by the comparator. At transition from the transfer period (the period during which VOP and VON are sampled by CDAC1) to the commencement of comparison by the comparator, a timing margin may often be required such as to avoid the loss of stored electric charge. In such a case, if the available time for comparison is evenly assigned to each bit from MSB to LSB, the effective time period for comparing MSB may be too short. In order to avoid this, a relatively long time period is assigned only to the first comparison period following the transition from the transfer period (the period during which VOP and VON are sampled by CDAC1) to the commencement of comparison by the comparator.

FIGS. 23A through 23D, FIGS. 24A through 24C, and FIGS. 25A through 25C are drawings showing examples of waveforms obtained by circuit simulation in which the circuit of FIG. 21 is designed to operate at the timing as shown in FIG. 22.

Figure 24A:
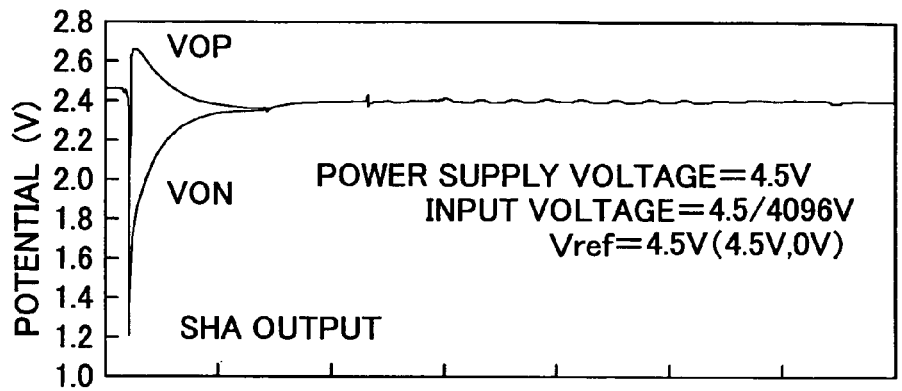
FIGS. 24A through 24C are diagrams showing signal waveforms illustrating the operation of the successive approximation A/D converter according to the present invention.
Figure 24B:
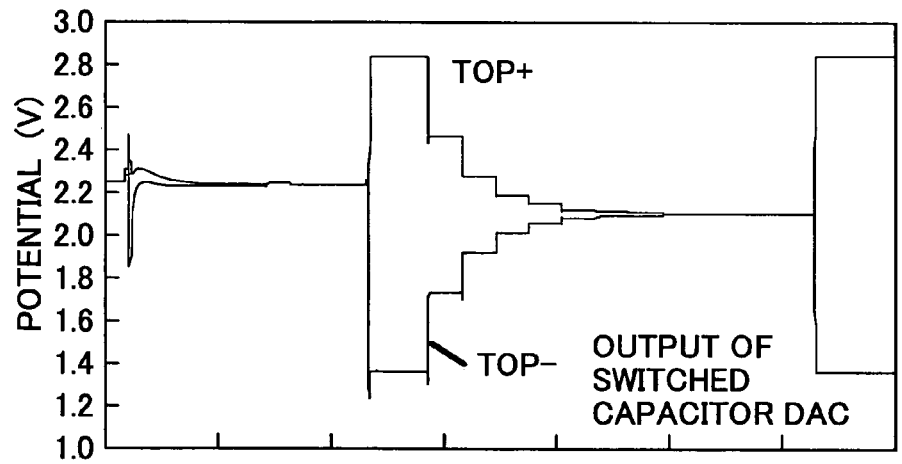
Figure 24C:
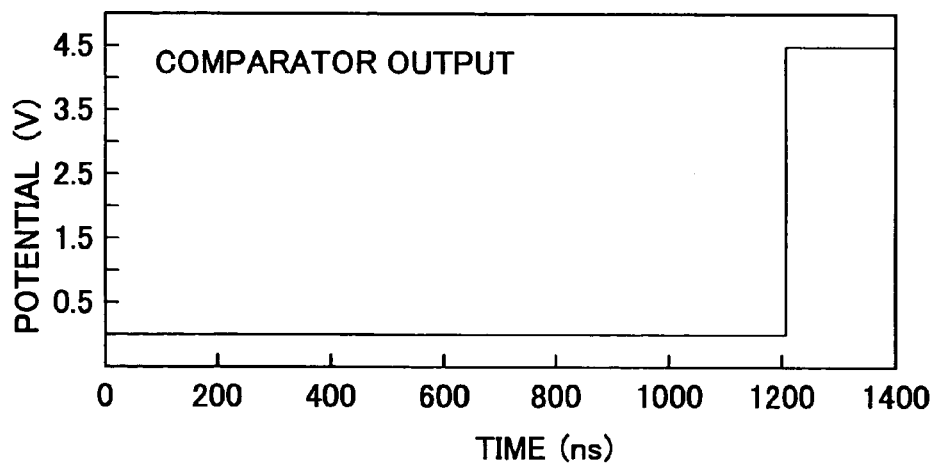
Figure 25A:
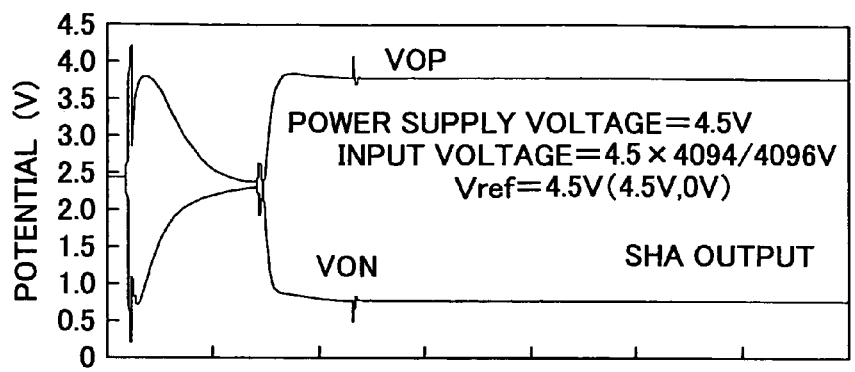
FIGS. 25A through 25C are diagrams showing signal waveforms illustrating the operation of the successive approximation A/D converter according to the present invention.
Figure 25B:
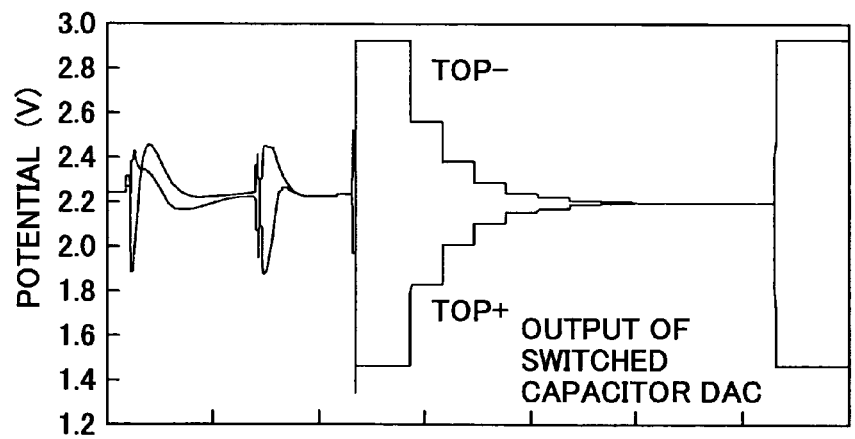
Figure 25C:
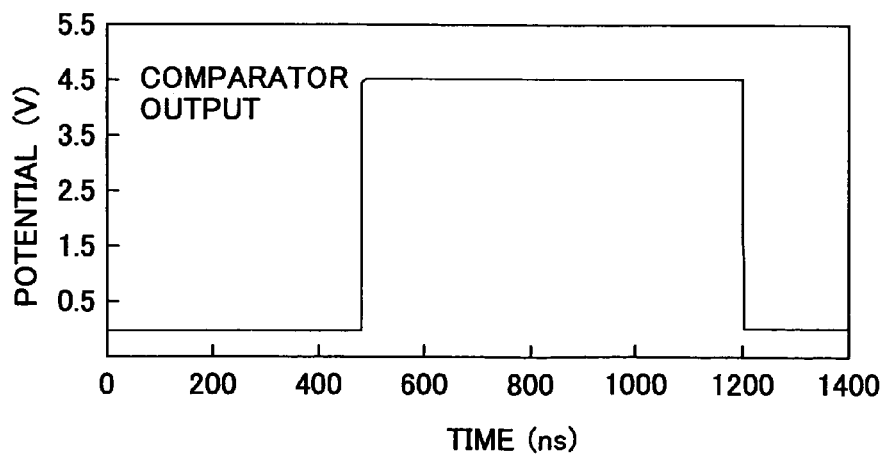

FIGS. 23A through 23D are waveform diagrams showing waveforms in the case of the power supply voltage 4.5 V, Vref+=4.5 V, Vref−=0 V, VIN+=3 V, and VIN−=0 V. FIGS. 24A through 24C are waveform diagrams showing waveforms in the case of the power supply voltage 4.5 V, Vref+=4.5 V, Vref−=0 V, VIN+=4.5/4096 V, and VIN−=0 V. Here, VIN+ is 1/4096 of 4.5 V. FIGS. 25A through 25C are waveform diagrams showing waveforms in the case of the power supply voltage 4.5 V, Vref+=4.5 V, Vref−=0 V, VIN+=4.5×4094/4096 V, and VIN−=0 V. Here, VIN+ is 4094/4096 of 4.5 V.

This example is directed to 12-bit A/D conversion, so that an expected conversion result is 101010101010 for FIGS. 23A through 23D, 000000000001 for FIGS. 24A through 24C, and 111111111110 for FIGS. 25A through 25C.

Figure 23A:
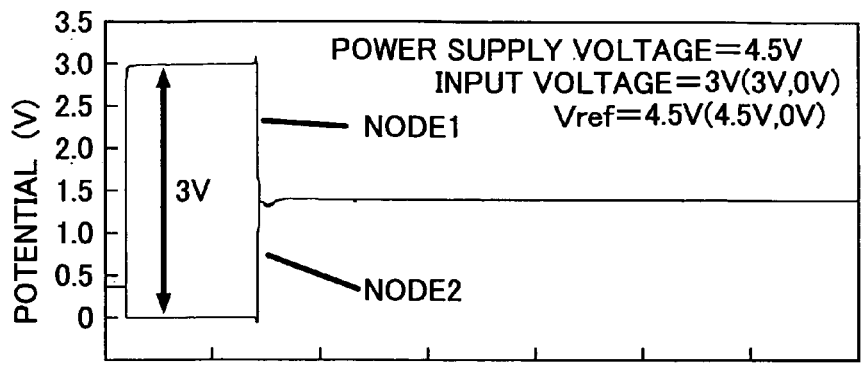
FIGS. 23A through 23D are diagrams showing signal waveforms illustrating the operation of the successive approximation A/D converter according to the present invention.

The waveforms shown in FIG. 23A represent signals appearing at NODE1 and NODE2 of the sample-hold amplifier circuit shown in FIG. 5. During the sampling period (as shown in FIG. 23) of the sample-hold amplifier circuit, NODE1 is set to 3 V, and NODE2 is set to 0 V. During the period for transfer from the sample-hold amplifier circuit to the switched capacitor DAC (shown in FIG. 23B as "transfer from SHA to CDAC), the potentials at NODE1 and NODE2 are set equal to each other (via SW17 shown in FIG. 5). The equalization of the potentials at NODE1 and NODE2 is shown in the waveforms of FIG. 23A.

Figure 23B:
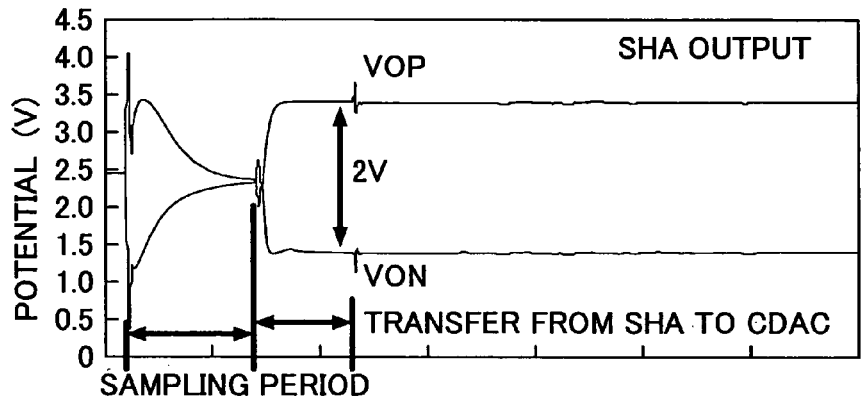

Simultaneously, a potential difference corresponding to the sampled potential difference appears at VOP and VON. This is shown in the waveforms of FIG. 23B. Since the voltage gain of the sample-hold amplifier circuit is ⅔ in this example, the potential difference between the outputs VOP and VON of the sample-hold amplifier circuit becomes equal to 2 V in response to the sampling of 3 V.

After the transfer period, a comparison by the comparator starts. Through this comparison, the output of the comparator exhibits changes "101010101010" as shown in FIG. 23 (d). This matches the expected value of the conversion result as previously noted.

Figure 23C:
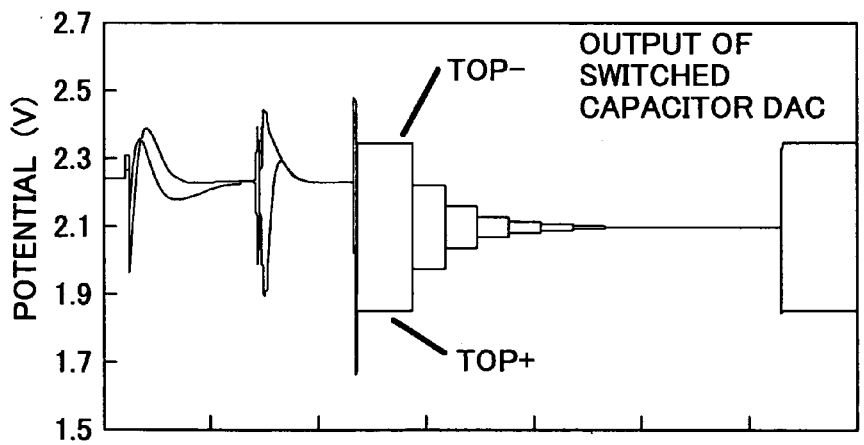
Figure 23D:
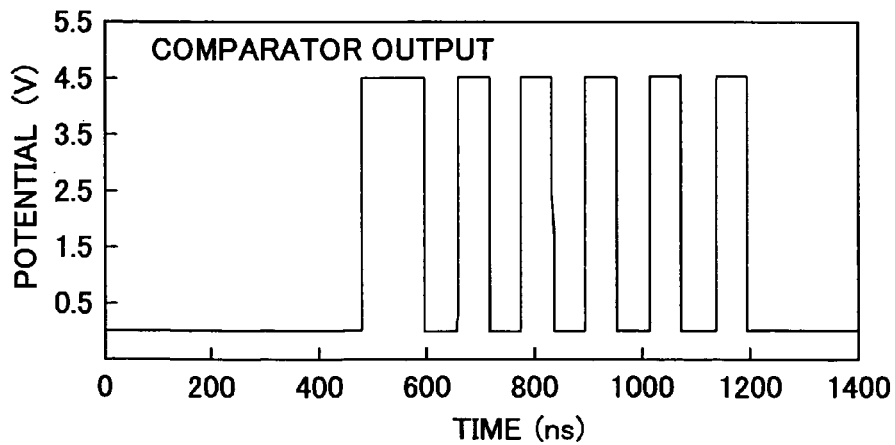

The waveforms of the outputs of the switched capacitor DAC shown in FIG. 23C illustrate the waveforms of TOP+ and TOP−. Keeping in line with the changes "101010101010" of the comparator output, the sign of the potential difference alternates. The potentials of TOP+ and TOP− are substantially the same at the end of the comparison.

For different operation conditions, FIG. 24A shows VOP and VON, FIG. 24B illustrating TOP+ and TOP−, and FIG. 24C exhibiting the comparator output. As can be seen, the comparator output matches the expected value 000000000001. Since the input potential difference is as small as 4.5/4096 V, VOP and VON are approximately the same potential. TOP+ and TOP− changes from a state where the potential difference is large to a state where the potential difference is small, and, in the end, become substantially equal to each other.

For different operation conditions, FIG. 25A shows VOP and VON, FIG. 25B illustrating TOP+ and TOP−, and FIG. 25C exhibiting the comparator output. In contrast with FIGS. 24A through 24C, the input potential difference is nearly at its maximum value of 4.5 V, so that the signal amplitude of VOP and VON is large as shown in FIG. 25A. Since the voltage gain of the sample-hold amplifier circuit is ⅔ in this example, a potential difference between the outputs VOP and VON of the sample-hold amplifier circuit is 3 V. This is shown in FIG. 25A.

The comparator output matches the expected value 111111111110. TOP+ and TOP− changes from a state where the potential difference is large to a state where the potential difference is small, and, in the end, become substantially equal to each other. In this case, the sign is opposite to what is shown in FIG. 24B.

Figure 26A:
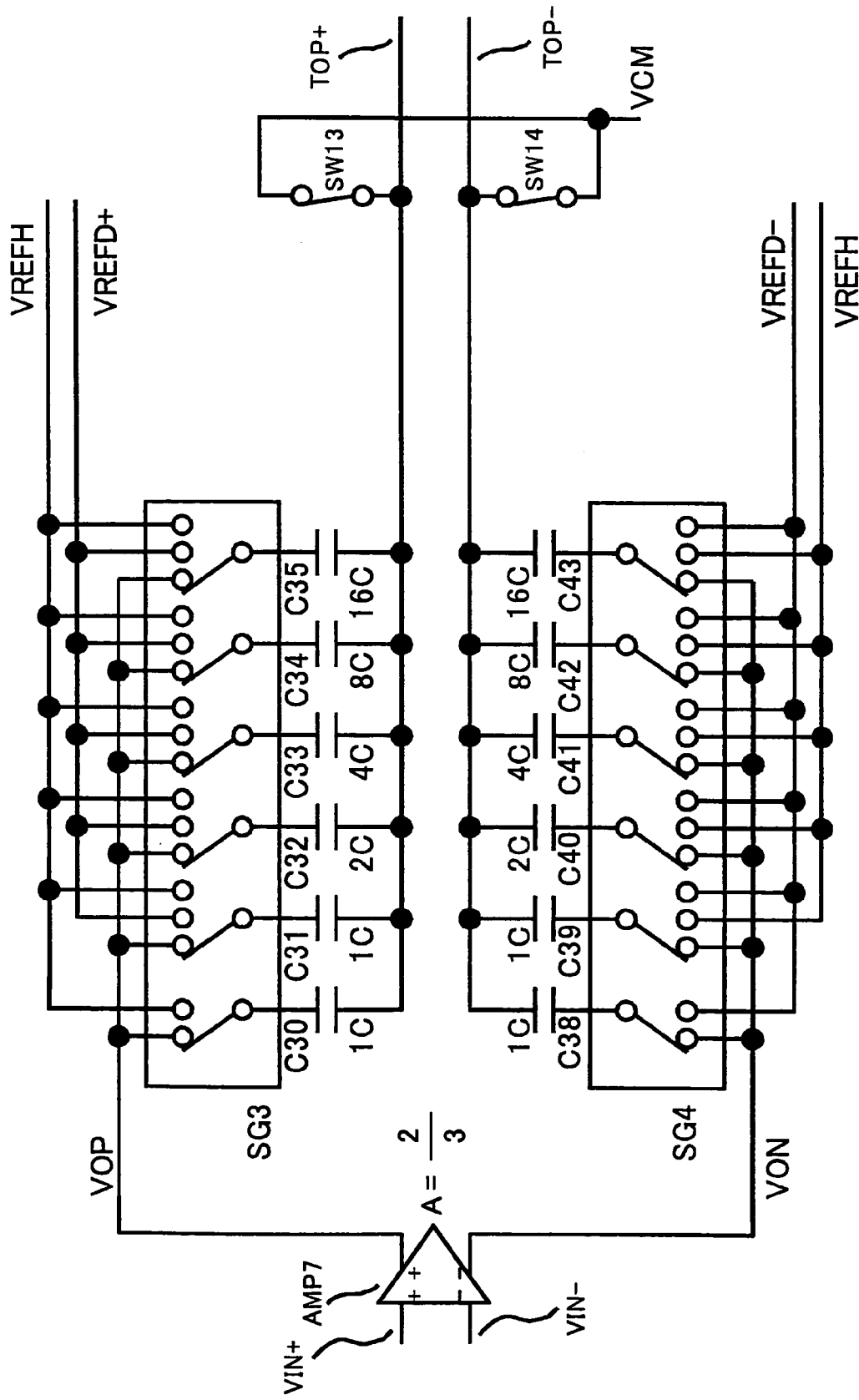
FIGS. 26A and 26B are circuit diagrams showing the configuration of another embodiment of the successive approximation A/D converter according to the present invention.
Figure 26B:
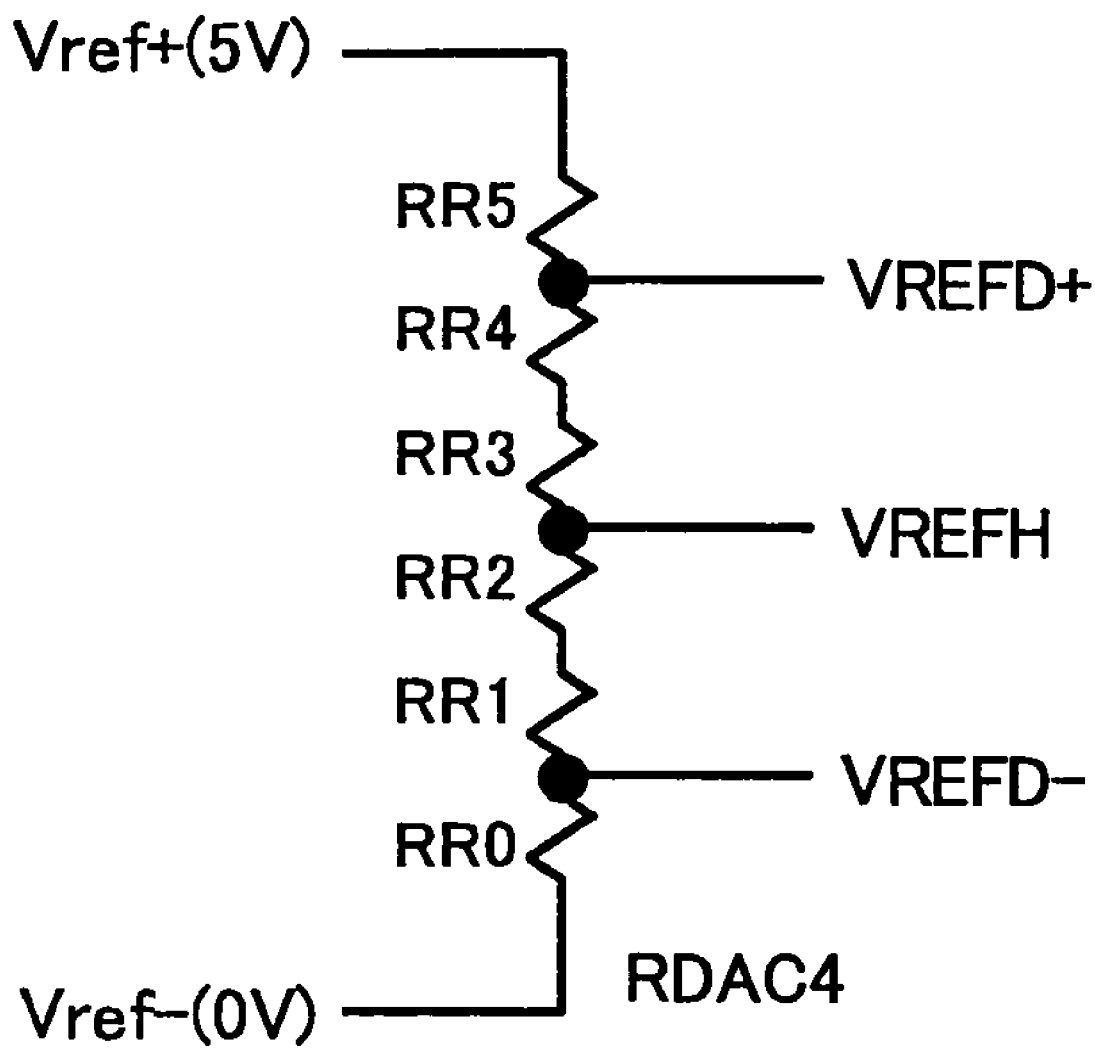

FIGS. 26A and 26B are circuit diagrams showing the configuration of another embodiment of the successive approximation A/D converter according to the present invention. This circuit includes a sample-hold amplifier circuit (or amplifier) AMP7, switches SW13, SW14, SG3, and SG4, capacitors C30 through C35, and capacitors C38 through C43 shown in FIG. 26A, and further includes a resistor D/A converter RDAC4 shown in FIG. 26B. VIN+ is a plus-side analog input, and VIN− is a minus-side analog input. VOP and VON are a plus-side output and a minus-side output (internal analog signal (+), internal analog signal (−)), respectively, of the sample-hold amplifier circuit. TOP+ designates a plus-side top plate of a capacitor array, and TOP− designates a minus-side top plate of the capacitor array. Vref+ is a plus-side reference potential (5V), and Vref− is a minus-side reference potential (0V). VCM is a bias potential (2.5 V) applied to the top plate at the time of sampling. RDAC4 includes resistors RR0 through RR5. VREFD+, VREFD−, and VREFH are reference potentials generated by the resistor DAC (RDAC4).

The positions of the switches illustrated in FIG. 26A show their positions at the time of sampling VOP and VON. In FIG. 26, the circuit portions performing the same functions as those of FIG. 5, FIG. 16, FIGS. 17A and 17B, and FIGS. 18A and 18B are referred to by the same numerals. The circuit of FIGS. 26A and 26B differs from the circuit of FIG. 16 in that the resistor DAC (RDAC4) is provided in place of the scaling circuit SCL1 used in the circuit of FIG. 16. The resistor DAC (RDAC4) serves to generate the reference potentials VREFD+, VREFD−, and VREFH. These reference potentials are utilized to produce a proper A/D conversion result.

In the circuit shown in FIG. 16, when a digital code corresponding to the analog inputs is searched for, the bottom plates of the capacitors C31 through C35 and C39 through C43 are selectively coupled to either Vref+ or Vref−. As shown in FIG. 6, FIG. 7, and FIG. 8, if the voltage gain of the sample-hold amplifier circuit is ⅔, for example, the potential VOP is VCM (=Vdd/2) in response to the analog input corresponding to all the bits being 0, and is 5Vdd/6 in response to the analog input corresponding to all the bits being 1. Provision can thus be made such that these potentials are directly generated by the resistor DAC to manipulate the potential of the bottom plates of the switched capacitor DAC, thereby producing a desired digital conversion result.

The resistors RR0 through RR5 divide the potential difference between Vref+ and Vref− by six. Accordingly, VREFD+ is a potential corresponding to ⅚, VREFD− corresponding to ⅙, and VREFH corresponding to ½.

By considering the relationships between the potentials shown in FIG. 6 and the relationships between VREFD+, VREFD−, and VREFH, it may be easy to understand that the circuit of FIG. 26 produces the same digital conversion result as does the circuit of FIG. 16. FIG. 26 is directed to an example in which the voltage gain of the amplifier is ⅔. Based on the same principle, the circuit of FIG. 16 can be generalized for any voltage gains.

Figure 27:
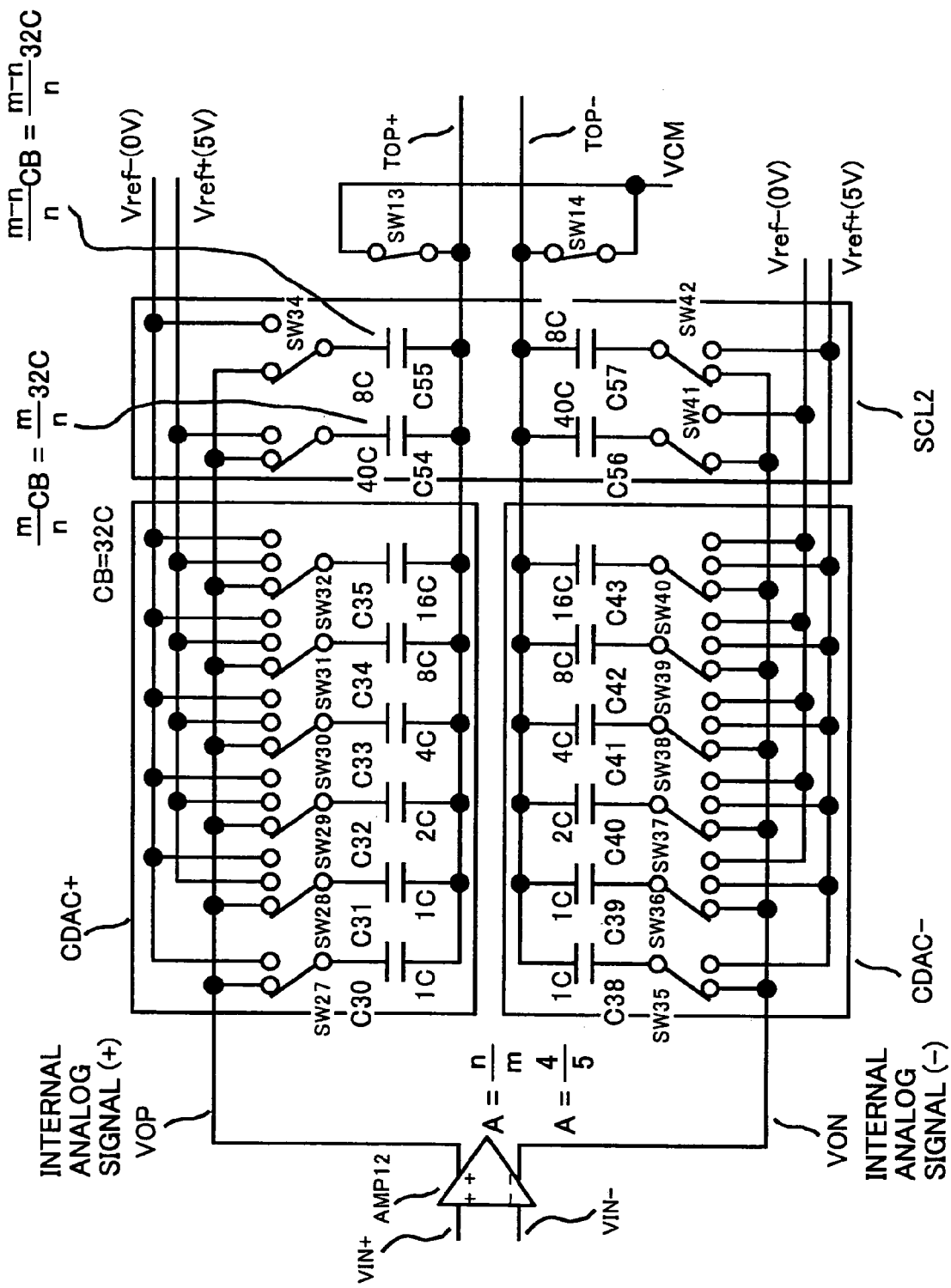
FIG. 27 is a circuit diagram showing the configuration of another embodiment of the successive approximation A/D converter according to the present invention.

FIG. 27 is a circuit diagram showing the configuration of another embodiment of the successive approximation A/D converter according to the present invention. The circuit of FIG. 27 includes switches SW13, SW14, and SW27 through SW42, capacitors C30 through C35, C38 through C43, and C54 through C57, and an amplifier AMP12. VIN+ is a plus-side, analog input, and VIN− is a minus-side analog input. VOP and VON are a plus-side output and a minus-side output (internal analog signal (+), internal analog signal (−)), respectively, of the amplifier AMP12. TOP+ designates a plus-side top plate of a capacitor array, and TOP− designates a minus-side top plate of the capacitor array. Vref+ is a plus-side reference potential (5V), and Vref− is a minus-side reference potential (0V). VCM is a bias potential (2.5 V) applied to the top plate at the time of sampling. CDAC+ is a plus-side switched capacitor DAC, and CDAC− is a minus-side switched capacitor DAC. Further, capacitors C54 through C57 constitute a scaling circuit SCL2. The scaling circuit SCL2 adjusts the digital output of the A/D converter such that the output of the sample-hold amplifier circuit responding to the inputting of the reference voltage (i.e., the potential difference between Vref+ and Vref−) into the sample-hold amplifier circuit corresponds to the maximum value of the digital output of the A/D converter. A value kC (k: integer) shown alongside each capacitor Cn (n: integer) specifies the relative size of the corresponding capacitance.

In FIG. 27, circuit portions performing the same functions as those of FIG. 16 are referred to by the same numerals. FIG. 27 illustrates a circuit example in which the voltage gain of the amplifier AMP7 used in the circuit of FIG. 16 is change to ⅘.

In FIG. 27, "A=n/m" shown alongside the amplifier AMP12 represents the voltage gain of the amplifier AMP12, and is ⅘ in this example. Under this condition (A=⅘), if a total capacitance of the plus-side (or minus-side) switched capacitor DAC is 32C, then, the capacitors C54 and C56 have a capacitance of 40C, and the capacitors C55 and C57 have a capacitance of 8C. As shown in this specific example, the circuit of the present invention is not limited to application to a voltage gain of ⅔, but is applicable to any other voltage gains.

As described heretofore, the present invention provides a sample-hold amplifier circuit having the voltage gain that is smaller than 1, and also provides a switched capacitor DAC that samples the outputs of the sample-hold amplifier circuit. With this provision, the amplifier circuit properly operates to perform A/D conversion with respect to analog input signals varying over the rail-to-rail range (the range of the power supply voltage) even when the reference voltage (i.e., the potential difference between Vref+ and Vref−) and the analog input potential difference are equal to the power supply voltage. Further, capacitors are provided that adjust (perform the scaling of) the digital output of the A/D converter such that the output of the sample-hold amplifier circuit responding to the inputting of the reference voltage (i.e., the potential difference between Vref+ and Vref−) into the sample-hold amplifier circuit corresponds to the maximum value of the digital output of the A/D converter. With this provision, a proper digital output value (i.e., the same digital output value that is obtained directly sampling the analog signals by use of the switched capacitor DAC) is obtained despite the use of the sample-hold amplifier circuit having the voltage gain thereof being smaller than 1.

Moreover, with the configuration in which the sample-hold amplifier circuit samples analog signals, the input capacitance of the sample-hold amplifier circuit can be designed independently of the switched capacitor DAC. Reduction in this input capacitance makes it possible to increase the speed of the successive approximation A/D converter.

Further, the present invention is not limited to these embodiments, but various variations and modifications may be made without departing from the scope of the present invention.

What is claimed is:

1. A successive approximation A/D converter, comprising:
a sample-hold amplifier circuit configured to sample and hold an input analog voltage to produce at an output node an internal analog voltage proportional to the input analog voltage with a voltage gain being smaller than 1;
a switched capacitor D/A converter coupled to the output node of said sample-hold amplifier circuit and including a plurality of capacitors for storing electric charge responsive to the internal analog voltage, each of the plurality of capacitors having one end thereof connected to the output node of the sample-hold amplifier circuit at a time of storing the electric charge so that said one end receives the internal analog voltage having the voltage gain smaller than 1, and said switched capacitor D/A converter configured to switch couplings of the capacitors in response to a control signal to produce at an output node a comparison analog voltage responsive to the internal analog voltage and the control signal;
a comparator coupled to the output node of said switched capacitor D/A converter to produce at an output node a comparison result signal responsive to the comparison analog voltage; and
a control circuit coupled to the output node of said comparator to supply the control signal responsive to the comparison result signal to said switched capacitor D/A converter.

2. A successive approximation A/D converter, comprising:
a sample-hold amplifier circuit configured to sample and hold an input analog voltage to produce at an output node an internal analog voltage proportional to the input analog voltage with a voltage gain being smaller than 1;
a switched capacitor D/A converter coupled to the output node of said sample-hold amplifier circuit and including a plurality of capacitors for storing electric charge responsive to the internal analog voltage, said switched capacitor D/A converter configured to switch couplings of the capacitors in response to a control signal to produce at an output node a comparison analog voltage responsive to the internal analog voltage and the control signal;
a comparator coupled to the output node of said switched capacitor D/A converter to produce at an output node a comparison result signal responsive to the comparison analog voltage; and
a control circuit coupled to the output node of said comparator to supply the control signal responsive to the comparison result signal to said switched capacitor D/A converter,
wherein the capacitors of said switched capacitor D/A converter include:
one or more first capacitors selectively coupled to either one of two reference potentials in response to the control signal; and
one or more second capacitors coupled to a predetermined one of the two reference potentials regardless of the control signal,
wherein the switched capacitor D/A converter is configured to adjust the comparison analog voltage by use of said second capacitors so as to compensate for the voltage gain of said sample-hold amplifier circuit being smaller than 1.

3. The successive approximation A/D converter as claimed in claim 2, wherein said switched capacitor D/A converter is configured to adjust the comparison analog voltage by use of said second capacitors such that all of said first capacitors are coupled to a same one of the two reference potential when the input analog voltage is equal to a difference between the two reference potentials.

4. A successive approximation A/D converter, comprising:
a sample-hold amplifier circuit configured to sample and hold an input analog voltage to produce at an output node an internal analog voltage proportional to the input analog voltage with a voltage gain being smaller than 1;
a switched capacitor D/A converter coupled to the output node of said sample-hold amplifier circuit and including plurality of capacitors for storing electric charge responsive to the internal analog voltage, said switched capacitor D/A converter configured to switch couplings of the capacitors in response to a control signal to produce at an output node a comparison analog voltage responsive to the internal analog voltage and the control signal;
a comparator coupled to the output node of said switched capacitor D/A converter to produce at an output node a comparison result signal responsive to the comparison analog voltage; and
a control circuit coupled to the output node of said comparator to supply the control signal responsive to the comparison result signal to said switched capacitor D/A converter,
wherein said sample-hold amplifier circuit is a switched capacitor sample-hold amplifier that includes:
an amplifier circuit;
a first capacitor coupled to an input node side of said amplifier circuit; and
a second capacitor coupled to an output node side of said amplifier circuit,
wherein a capacitance of said second capacitor is larger than a capacitance of said first capacitor.

5. The successive approximation A/D converter as claimed in claim 4, wherein said amplifier circuit includes:
a first amplifier circuit having an input node coupled to the input node side and an output node fed back to the input node side; and
a second amplifier circuit having an input node coupled to the output node of said first amplifier circuit to produce the internal analog voltage at an output node.

6. A successive approximation A/D converter, comprising:
a sample-hold amplifier circuit configured to sample and hold an input analog voltage to produce at an output node an internal analog voltage proportional to the input analog voltage with a voltage gain being smaller than 1;
a switched capacitor D/A converter coupled to the output node of said sample-hold amplifier circuit and including a plurality of capacitors for storing electric charge responsive to the internal analog voltage, said switched capacitor D/A converter configured to switch couplings of the capacitors in response to a control signal to produce at an output node a comparison analog voltage responsive to the internal analog voltage and the control signal;

a comparator coupled to the output node of said switched capacitor D/A converter to produce at an output node a comparison result signal responsive to the comparison analog voltage;

a control circuit coupled to the output node of said comparator to supply the control signal responsive to the comparison result signal to said switched capacitor D/A converter; and a resistor D/A converter having an output node thereof coupled to one of the capacitors that has a smallest capacitance.

7. The successive approximation A/D converter as claimed in claim 6, wherein said resistor D/A converter includes:

a plurality of resistors connected in series between two reference potentials; and a selector configured to select one of a plurality of divided potentials generated by said plurality of resistors.

* * * * *